(12) United States Patent
Marino et al.

(10) Patent No.: US 10,622,492 B2
(45) Date of Patent: Apr. 14, 2020

(54) VARIABLE CAPACITOR FLAT-BAND VOLTAGE ENGINEERING

(71) Applicant: QUALCOMM Incorporated, San Diego, CA (US)

(72) Inventors: Fabio Alessio Marino, San Marcos, CA (US); Narasimhulu Kanike, San Diego, CA (US); Francesco Carobolante, Carlsbad, CA (US); Paolo Menegoli, San Jose, CA (US); Qingqing Liang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/871,638

(22) Filed: Jan. 15, 2018

(65) Prior Publication Data
US 2019/0221677 A1    Jul. 18, 2019

(51) Int. Cl.
| | | |
|---|---|---|
| *H01L 29/76* | (2006.01) | |
| *H01L 29/94* | (2006.01) | |
| *H01L 29/36* | (2006.01) | |
| *H01L 29/165* | (2006.01) | |
| *H01G 7/06* | (2006.01) | |
| *H01L 29/66* | (2006.01) | |
| *H01L 29/93* | (2006.01) | |

(52) U.S. Cl.
CPC .............. *H01L 29/94* (2013.01); *H01G 7/06* (2013.01); *H01L 29/165* (2013.01); *H01L 29/36* (2013.01); *H01L 29/66189* (2013.01); *H01L 29/93* (2013.01)

(58) Field of Classification Search
None
See application file for complete search history.

(56) References Cited

U.S. PATENT DOCUMENTS

| | | |
|---|---|---|
| 7,579,642 B1 | 8/2009 | Bulucea |
| 8,216,890 B2 | 7/2012 | Johnson et al. |
| 8,803,288 B1 * | 8/2014 | Marino ................. H01G 7/00 257/602 |

(Continued)

OTHER PUBLICATIONS

International Search Report and Written Opinion—PCT/US2018/064156—ISA/EPO—Feb. 20, 2019.

*Primary Examiner* — Hung K Vu
(74) *Attorney, Agent, or Firm* — Patterson & Sheridan, L.L.P.

(57) ABSTRACT

Certain aspects of the present disclosure provide semiconductor variable capacitors. One example semiconductor variable capacitor generally includes a semiconductor region, an insulative layer, and a first non-insulative region, the insulative layer being disposed between the semiconductor region and the first non-insulative region. In certain aspects, the semiconductor variable capacitor may also include a second non-insulative region disposed adjacent to the semiconductor region, and a third non-insulative region disposed adjacent to the semiconductor region, the second non-insulative region and the third non-insulative region having different doping types. In certain aspects, the semiconductor variable capacitor may also include an implant region disposed between the semiconductor region and the insulative layer. The implant region may be used to adjust the flat-band voltage of the semiconductor variable capacitor.

27 Claims, 18 Drawing Sheets

(56) References Cited

U.S. PATENT DOCUMENTS

| | | | |
|---|---|---|---|
| 8,963,289 B2* | 2/2015 | Marino | H01L 29/93 257/602 |
| 8,994,115 B2 | 3/2015 | Korec et al. | |
| 9,646,963 B1 | 5/2017 | Sun et al. | |
| 9,660,110 B2 | 5/2017 | Kim et al. | |
| 2012/0281336 A1* | 11/2012 | Marino | H01G 7/00 361/281 |
| 2018/0315864 A1* | 11/2018 | Li | H01L 29/93 |

* cited by examiner

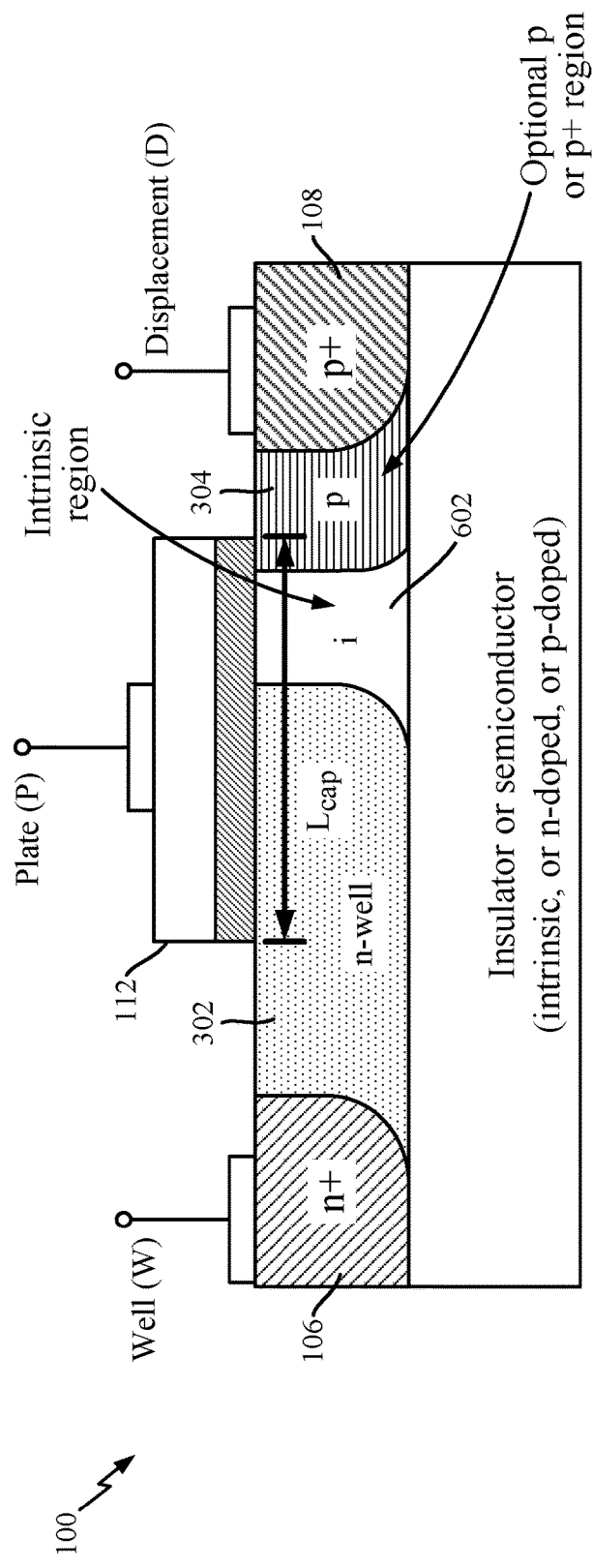
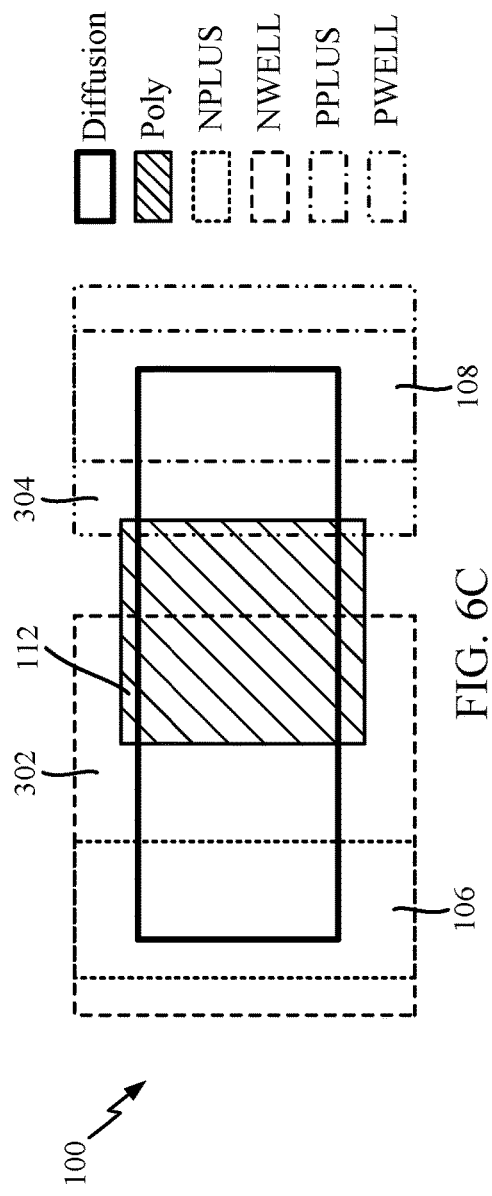
FIG. 6B
FIG. 6C

VARIABLE CAPACITOR FLAT-BAND VOLTAGE ENGINEERING

TECHNICAL FIELD

Certain aspects of the present disclosure generally relate to electronic circuits and, more particularly, to a variable semiconductor capacitor.

BACKGROUND

Semiconductor capacitors are fundamental components for integrated circuits. A variable capacitor is a capacitor whose capacitance may be intentionally and repeatedly changed under the influence of a bias voltage. A variable capacitor, which may be referred to as a varactor, is often used in inductor-capacitor (LC) circuits to set the resonance frequency of an oscillator, or as a variable reactance, e.g., for impedance matching in antenna tuners.

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure are generally directed to a semiconductor variable capacitor implemented with an implant region allowing for adjustment of a flat-band voltage of the capacitor.

Certain aspects of the present disclosure provide a semiconductor variable capacitor. The semiconductor variable capacitor generally includes a semiconductor region; an insulative layer; a first non-insulative region, the insulative layer being disposed between the semiconductor region and the first non-insulative region; a second non-insulative region disposed adjacent to the semiconductor region; a third non-insulative region disposed adjacent to the semiconductor region, the second non-insulative region and the third non-insulative region having different doping types; and an implant region disposed between the semiconductor region and the insulative layer, wherein the semiconductor region comprises at least two regions disposed between the second non-insulative region and the third non-insulative region, the at least two regions having at least one of different doping concentrations or different doping types, one or more junctions between the at least two regions being disposed above or below the first non-insulative region.

Certain aspects of the present disclosure provide a semiconductor variable capacitor. The semiconductor variable capacitor generally includes a semiconductor region comprising an intrinsic region; an insulative layer; a first non-insulative region, the insulative layer being disposed between the semiconductor region and the first non-insulative region; a second non-insulative region disposed adjacent to the semiconductor region; a third non-insulative region disposed adjacent to the semiconductor region, the second non-insulative region and the third non-insulative region having different doping types; and an implant region disposed between the semiconductor region and the insulative layer.

Certain aspects of the present disclosure provide a method for fabricating a semiconductor variable capacitor. The method generally includes forming a semiconductor region; forming an insulative layer; forming a first non-insulative region, the insulative layer being formed between the semiconductor region and the first non-insulative region; forming a second non-insulative region adjacent to the semiconductor region; forming a third non-insulative region adjacent to the semiconductor region, the second non-insulative region and the third non-insulative region having different doping types; and forming an implant region between the semiconductor region and the insulative layer, wherein the semiconductor region comprises at least two regions disposed between the second non-insulative region and the third non-insulative region, the at least two regions having at least one of different doping concentrations or different doping types, one or more junctions between the at least two regions being disposed above or below the first non-insulative region.

Certain aspects of the present disclosure provide a method for fabricating a semiconductor variable capacitor. The method generally includes forming a semiconductor region comprising an intrinsic region; forming an insulative layer; forming a first non-insulative region, the insulative layer being formed between the semiconductor region and the first non-insulative region; forming a second non-insulative region adjacent to the semiconductor region; forming a third non-insulative region adjacent to the semiconductor region, the second non-insulative region and the third non-insulative region having different doping types; and forming an implant region between the semiconductor region and the insulative layer.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIGS. 6B and 6C illustrate a cross-section and a top-down view, respectively, of a transcap device implemented with an intrinsic region and an n-well region, in accordance with certain aspects of the present disclosure.

DETAILED DESCRIPTION

Aspects of the present disclosure are generally directed to a semiconductor variable capacitor structure having a semiconductor region implemented with two or more regions having different doping concentrations and/or different doping types. In certain aspects, the semiconductor variable capacitor structure may be implemented with an implant region for adjusting a flat-band voltage of the capacitor.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
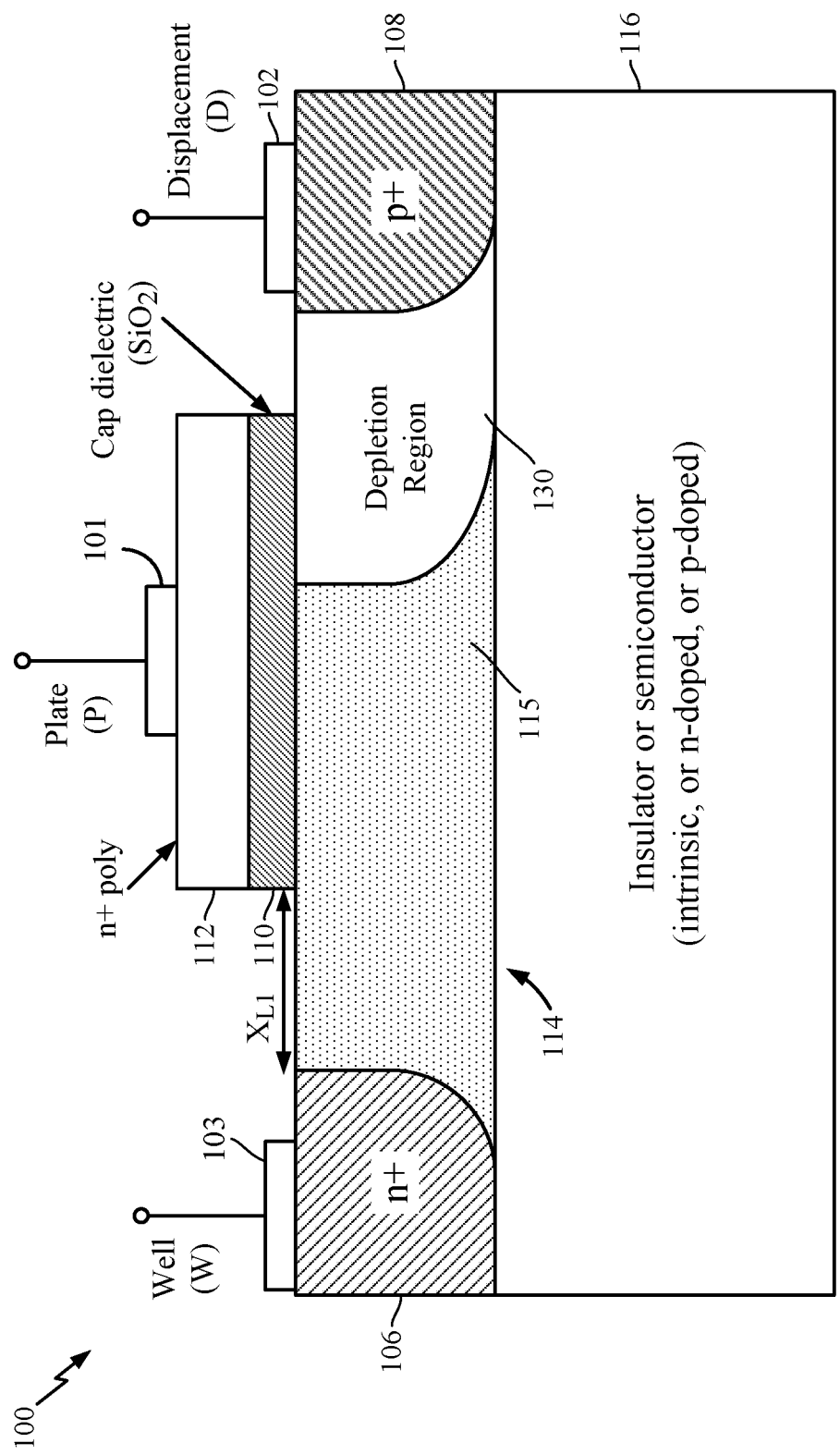
FIG. 1 illustrates an example semiconductor variable capacitor.

FIG. 1 illustrates an example structure of a transcap device 100, in accordance with certain aspects of the present disclosure. The transcap device 100 includes a non-insulative region 112 coupled to a plate (P) terminal 101, a non-insulative region 106 coupled to a well (W) terminal 103, and a non-insulative region 108 coupled to a displacement (D) terminal 102. Certain implementations of a transcap device use a plate oxide layer 110 disposed above a semiconductor region 114. The plate oxide layer 110 may isolate the W and P terminals, and thus, in effect act as a dielectric for the transcap device 100. The non-insulative region 106 (e.g., heavily n doped region) and the non-insulative region 108 (e.g., heavily p doped region) may be formed in the semiconductor region 114 and on two sides of the transcap device 100 in order to create p-n junctions. As used herein, a non-insulative region generally refers to a region that may be conductive or semiconductive.

In certain aspects, a bias voltage may be applied between the D terminal 102 and the W terminal 103 in order to modulate the capacitance between the P and W terminals. For example, by applying a bias voltage to the D terminal 102, a depletion region 130 may be formed between the p-n junction of the non-insulative region 108 and the region 115 of the semiconductor region 114. Based on the bias voltage, this depletion region 130 may widen under the plate oxide layer 110, reducing the area of the equivalent electrode formed by the semiconductor region 114, and with it, the effective capacitance area and capacitance value of the transcap device 100. Furthermore, the bias of the W and P terminals may be set as to avoid the formation of an inverted region underneath the oxide and operate the transcap device 100 in deep depletion mode. By varying the voltage of the W terminal with respect to the P and D terminals, both vertical and horizontal depletion regions may be used to modulate the capacitance between the W and P terminals.

The work-function of the non-insulative region 112 above the plate oxide layer 110 may be chosen to improve the device performance. For example, an n-doped poly-silicon material may be used (instead of p-doped), even if the semiconductor region 114 underneath the plate oxide layer 110 is doped with n-type impurities. In some aspects, a metallic material (also doped if desired) may be used for the non-insulative region 112 with an opportune work-function or a multi-layer stack of different metallic materials to obtain the desired work-function. In certain aspects, the non-insulative region 112 may be divided into two sub-regions, one n-doped and one p-doped, or a different metallic material may be used for each sub-region.

In some cases, the semiconductor region 114 may be disposed above an insulator or semiconductor region 116. The type of material for the region 116 may be chosen in order to improve the transcap device 100 performance. For example, the region 116 may be an insulator, a semi-insulator, or an intrinsic/near-intrinsic semiconductor in order to decrease the parasitic capacitances associated with the transcap device 100. In some cases, the region 116 may be made of n-doped or p-doped semiconductor with an appropriate doping profile in order to increase the transcap device Q and/or the control on the depletion region 130 that may be formed between the non-insulative region 108 and the region 115 of the semiconductor region 114 when applying a bias voltage to the D terminal 102. The region 116 may also be formed by multiple semiconductor layers or regions doped in different ways (n, p, or intrinsic). Furthermore, the region 116 may include semiconductors, insulating layers, and/or substrates or may be formed above semiconductors, insulating layers, and/or substrates.

To better understand the working principle of the transcap device 100, it may be assumed that the D terminal 102 is biased with a negative voltage with respect to the W terminal 103. The width of the depletion region 130 in the semiconductor region 114 may be controlled by applying a control voltage to the D terminal 102 or to the W terminal 103. The capacitance between the W and P terminals may depend on the width of the depletion region 130 in the semiconductor region 114, and thus, may be controlled by applying the control voltage to the D terminal 102. Furthermore, the variation of the bias voltage applied to the D terminal 102 may not alter the direct-current (DC) voltage between the W and P terminals, allowing for improved control of the device characteristics.

In some cases, it may be preferable to have the non-insulative region 106 and/or non-insulative region 108 a distance away from the plate oxide layer 110 in order to reduce the parasitic capacitance associated with the non-insulative region 108 and improve the isolation of the non-insulative region 106 for high control voltages. For example, the non-insulative region 106 may be partially overlapped with the plate oxide layer 110, or the non-insulative region 106 may be formed at a distance from the edge of the plate oxide layer 110 to increase the device tuning range and linearity. In the latter case, the voltage-withstanding capability of the device is improved since a portion of a radio-frequency (RF) signal, that may be applied to the P and W terminals, drops between the oxide edge and the non-insulative region 106 instead of being applied entirely across the plate oxide layer 110. The non-insulative region 108 may be partially overlapped with the plate oxide layer 110, or the non-insulative region 108 may be spaced apart from the plate oxide layer 110 so as to reduce the parasitic capacitance between the P terminal 101 and the D terminal 102.

In certain aspects, the semiconductor region 114 may be implemented with a p-well region to improve the breakdown voltage of the p-n junction between the non-insulative region 108 and the region 115 of the semiconductor region 114, decreasing, at the same time, the parasitic capacitance between the P terminal 101 and the D terminal 102, as described in more detail herein. Similarly, the semiconductor region 114 may be implemented with an n-doped region between the non-insulative region 106 and region 115 of the semiconductor region 114 in order to regulate the doping concentration between the plate oxide layer 110 and the non-insulative region 106, as described in more detail herein. In certain aspects of the present disclosure, the semiconductor region 114 may be implemented with two or more regions having different doping concentrations and/or different doping types. A junction between the two or more regions may be disposed below the plate oxide layer 110 to improve the Q of the transcap device 100.

Figure 2:
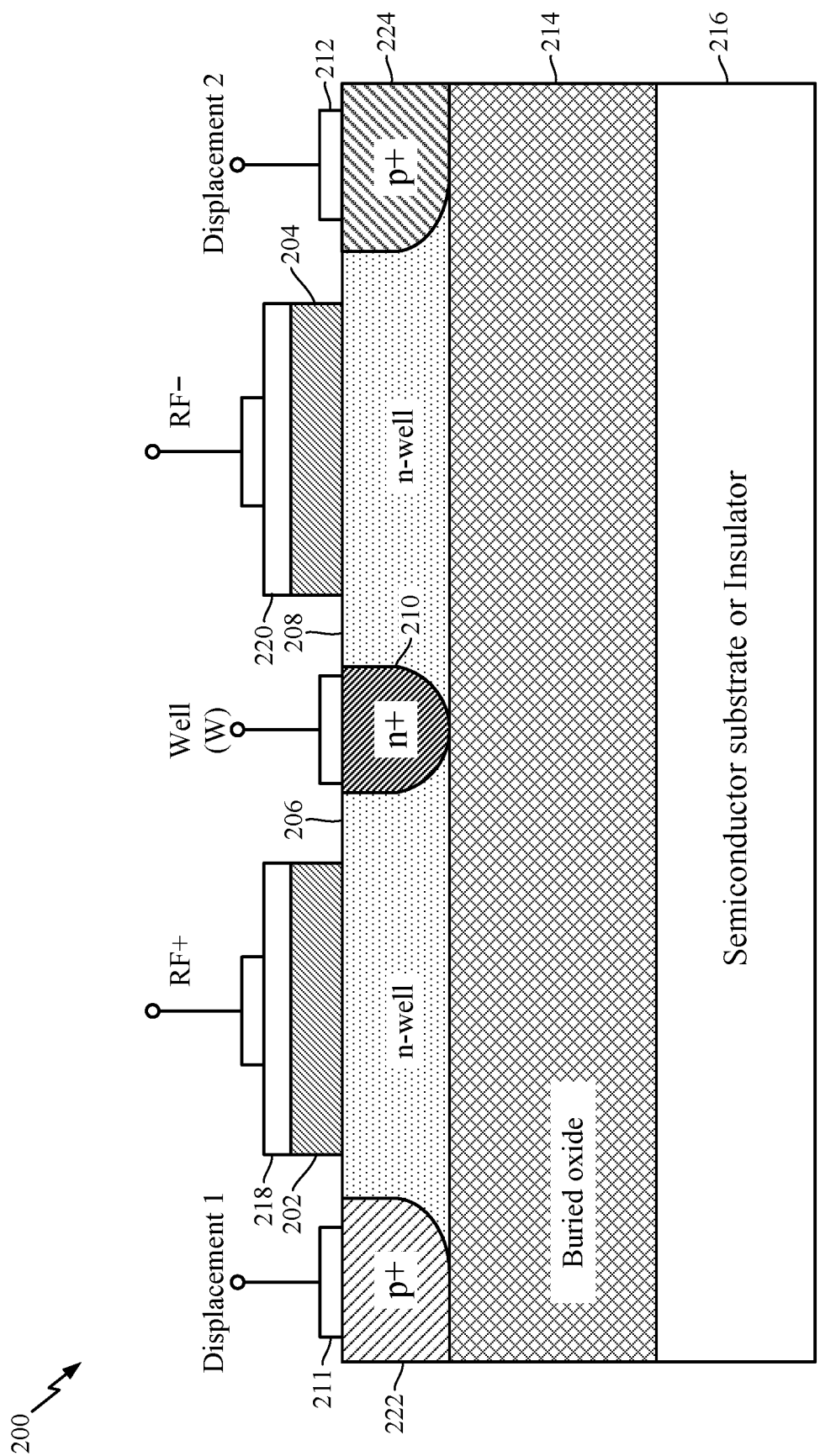
FIG. 2 illustrates an example differential semiconductor variable capacitor.

FIG. 2 illustrates an example differential transcap device 200. The differential transcap device 200 may be obtained by disposing two of the transcap devices 100 back-to-back. In this example, RF+ and RF− terminals (e.g., corresponding to the P terminal in FIG. 1) correspond to the positive and negative nodes of a differential RF port for a differential RF signal. The RF+ terminal may be coupled to a non-insulative region 218, and the RF− terminal may be coupled to a non-insulative region 220, each of the non-insulative regions 218 and 220 disposed above respective oxide layers 202 and 204. N-well regions 206 and 208 may be coupled to a W terminal via a non-insulative region 210 (e.g., n+), as illustrated. The differential transcap device 200 also includes D terminals 211 and 212 coupled to respective non-insulative regions 222 and 224. A bias voltage may be applied to the D terminals 211 and 212 (or to the W terminal with respect to the other terminals of the device) to adjust a depletion region of the n-well regions 206 and 208, respectively, thereby adjusting the capacitance between respective RF+ and RF− terminals and the W terminal. In some aspects, a buried oxide layer 214 may be positioned below the n-well regions 206 and 208 and above a semiconductor substrate or insulator 216, as illustrated.

The capacitance density achievable with the transcap technology may be increased at the expense of device performance. For example, with reference to FIG. 2, the capacitance density may be increased by reducing the distance between the non-insulative regions 218 and 220 for the RF+ and RF− terminals. However, reducing the distance between the non-insulative regions 218 and 220 may increase the parasitic capacitance associated with the structure, lowering the tuning range of the transcap device 200.

The capacitor-voltage (C-V) characteristic of the transcap device 100 determines its performance parameters, such as tuning range (Cmax/Cmin), max control voltage for achieving the full tuning range, Q, and linearity of the transcap device. However, these figures of merit may depend on several process parameters, such as well doping, oxide thickness, n+/p+ proximity to the Plate terminal, and Plate length. A tradeoff may exist between these performance parameters. For example, the tuning range of a transcap device may be increased either by increasing the plate length or by placing the n+ region far away from the plate terminal. However, in both cases, the device Q is degraded, and the tuning voltage used to improve tunability of the transcap device is increased. Similarly, the oxide thickness may be increased to improve the Q, but this choice may lead to a degradation of the tuning range. Likewise, higher well doping may provide better linearity and Q, but it may also degrade the device tuning range. Certain aspects of the present disclosure soften these tradeoffs. Moreover, certain aspects of the present disclosure allow for a sharper transition between capacitance levels of the transcap device, which may be beneficial for transcap usage in digital tuning.

Figure 3:
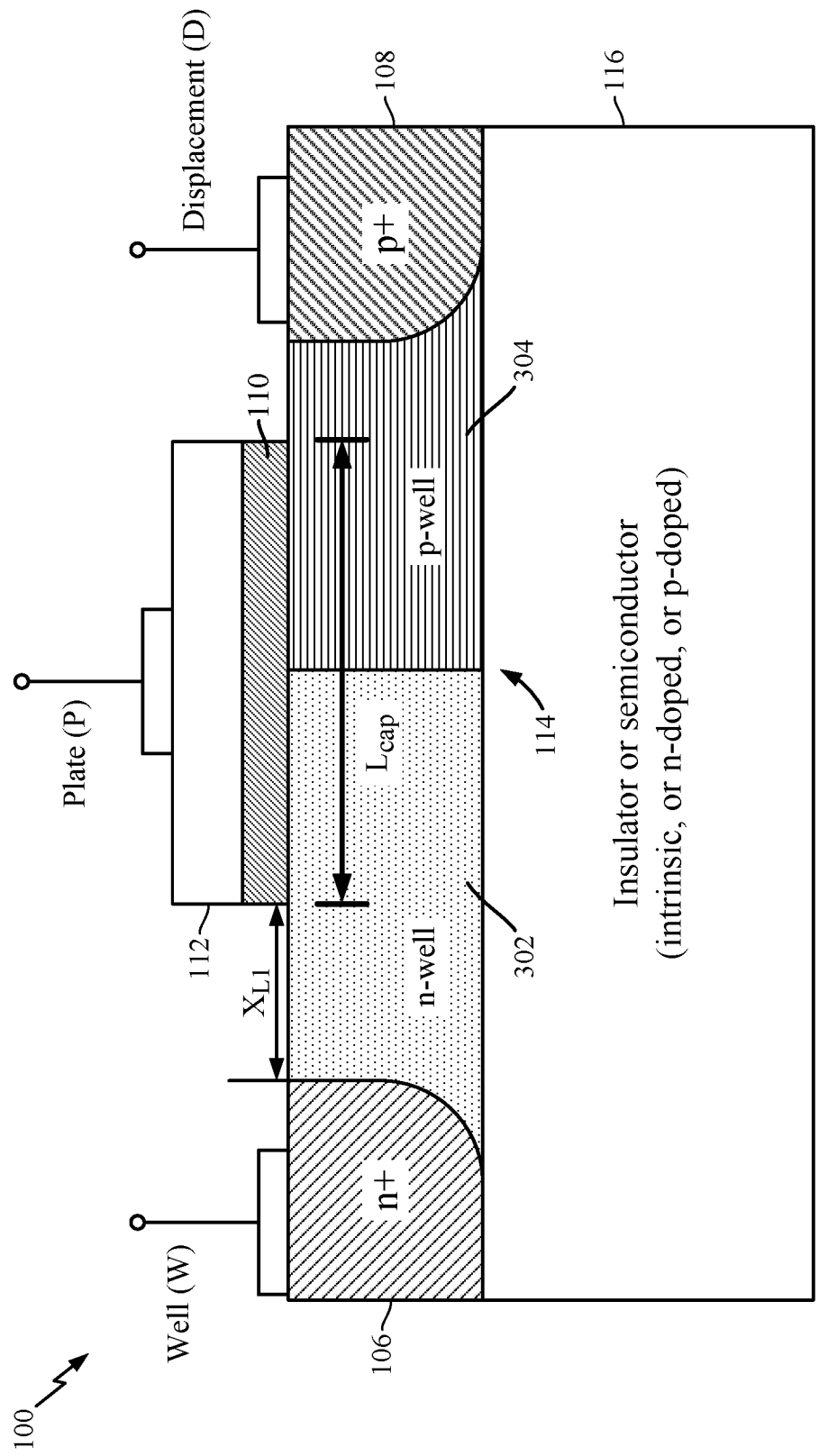
FIG. 3 illustrates a transcap device having a p-n junction formed underneath a plate oxide layer, in accordance with certain aspects of the present disclosure.

FIG. 3 illustrates the transcap device 100 having a p-n junction formed underneath the plate oxide layer 110, in accordance with certain aspects of the present disclosure. For example, the region between the non-insulative regions 106 and 108 may be implemented with an n-well region 302 and a p-well region 304, having a p-n junction underneath the plate oxide layer 110, modifying the electrical field distribution inside the transcap device 100 during operation with respect to the transcap device 100 of FIG. 1. For example, the behavior of the capacitance and Q as a function of the control voltage depends on how the depletion region created by a horizontal electric field, from the non-insulative region 108, moves with respect to the depletion region created by a vertical electric field from the non-insulative region 112. As the p-n junction between the n-well and p-well regions 302 and 304 is formed closer to the n+ region, the depletion region caused by the horizontal electric field may show its effect at a lower control voltage in the C-V characteristic, allowing for the manipulation of the Q of the transcap device 100. This configuration can be useful, especially in modern silicon-on-insulator (SOI) technologies that may use a thin active silicon layer, where the device-Q-versus-control-voltage plot shows a dip due to the unbalanced electric field. In some cases, the structure of transcap device 100 may be implemented by using separate n-well and p-well implantation masks during fabrication.

In certain aspects, the doping concentration of the p-well region 304 may be used to manipulate the electric field distribution inside the transcap device 100. For example, the p-well region 304 may be low-doped or may be replaced with an intrinsic (i) region so as to obtain a p-i-n junction between the non-insulative regions 106 and 108 and further sharpen the transition between high and low capacitance of the transcap device 100. In this case, the length of the intrinsic region may be set to obtain the desired control voltage and C-V characteristic of the transcap device.

Figure 4:
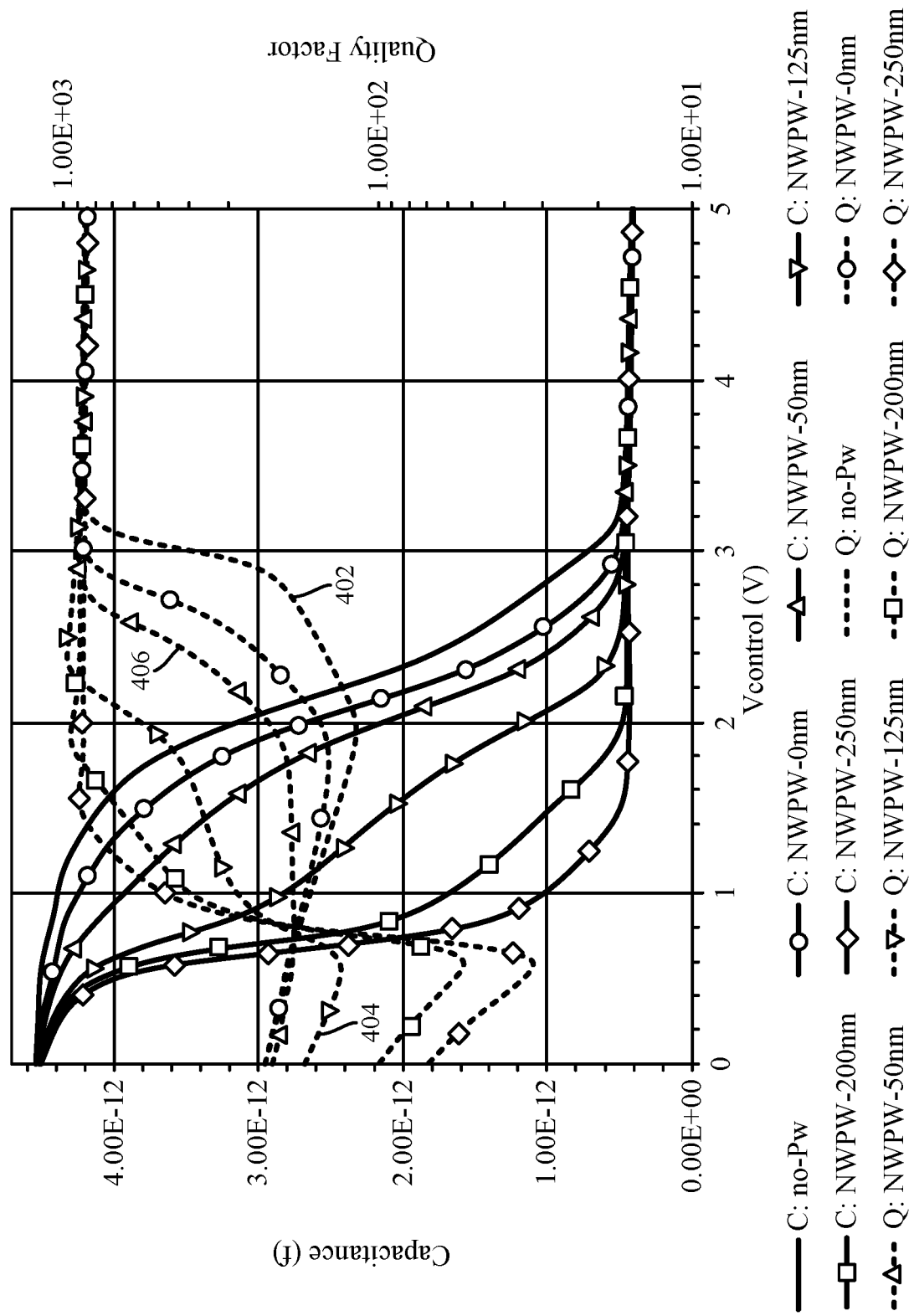
FIG. 4 is a graph illustrating the capacitance and quality factor (Q) of a transcap device as a function of the control voltage for different p-well region lengths, in accordance with certain aspects of the present disclosure.

FIG. 4 is a graph 400 illustrating the capacitance and Q of a transcap device as a function of the control voltage for different p-well region lengths, in accordance with certain aspects of the present disclosure. As illustrated, the structure of the transcap device 100 may be adjusted to improve the device Q from around 120 up to almost 190 with little to no degradation of the tuning range. Alternatively, the control voltage may be reduced up to 2 volts to obtain a sharp transition in the C-V characteristic, which may be especially beneficial in digital applications.

Figure 5A:
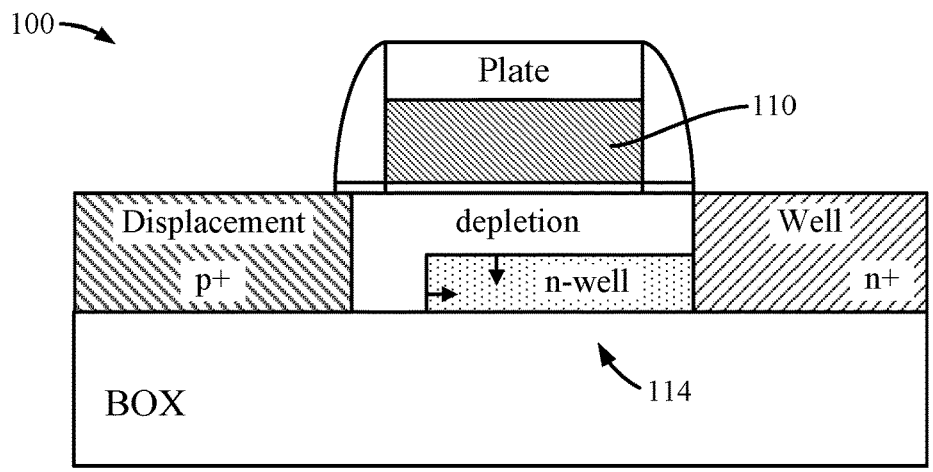
FIGS. 5A-5C illustrate a transcap device implemented with different semiconductor region structures, in accordance with certain aspects of the present disclosure.
Figure 5B:
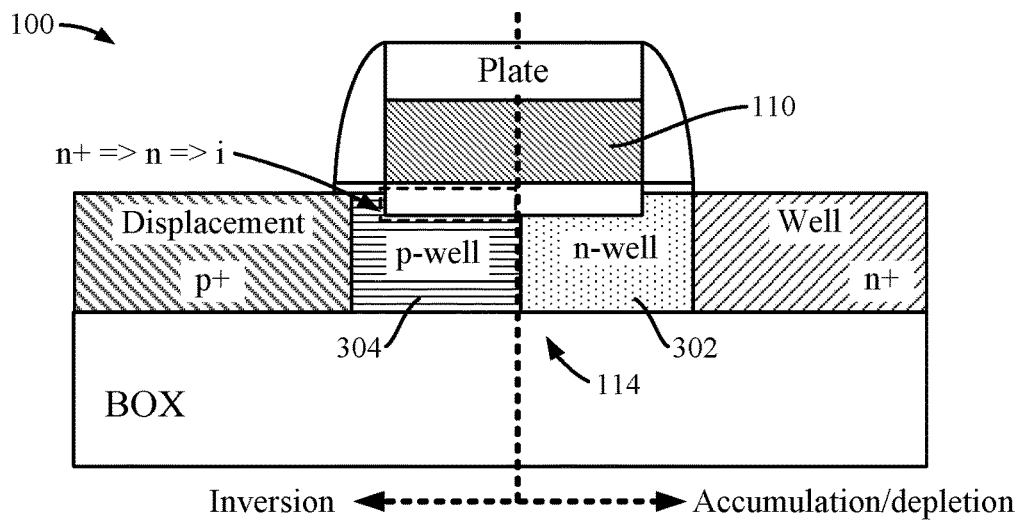
Figure 5C:
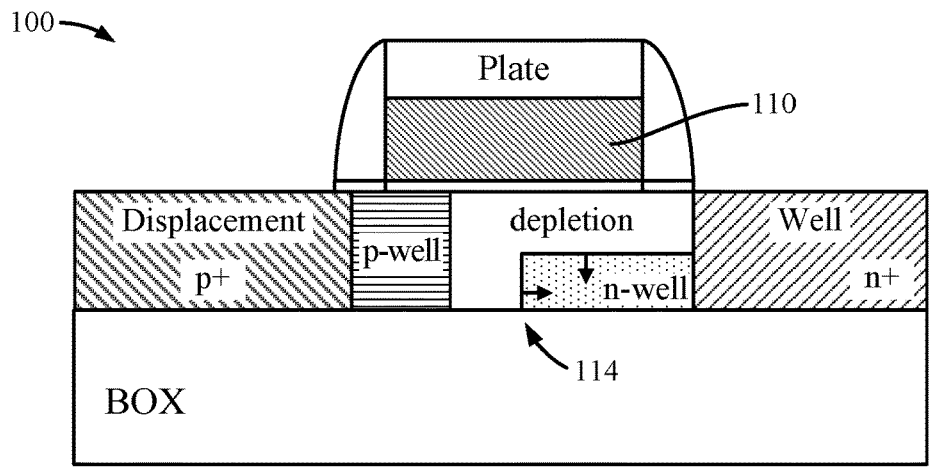

FIGS. 5A-5C illustrate the transcap device 100 implemented with different structures for the semiconductor region 114, in accordance with certain aspects of the present disclosure. The Q curve 402 of graph 400 corresponds to the configuration of the transcap device 100 in FIG. 5A implemented without a p-well region. The Q curve 404 of graph 400 corresponds to the configuration of the transcap device 100 in FIG. 5B implemented with a 125 nm p-well region length. The Q curve 406 of graph 400 corresponds to the configuration of the transcap device 100 in FIG. 5C implemented with a 50 nm p-well region length. As illustrated in FIG. 5B, when a positive bias voltage is applied at the P terminal, the p-well region 304 may be inverted at its interface with the plate oxide layer 110, and electrons are accumulated in the n-well region 302. This causes the maximum capacitance of the transcap device 100 of FIG. 5B to be the same as that of a transcap device realized without a p-well region.

Figure 6A:
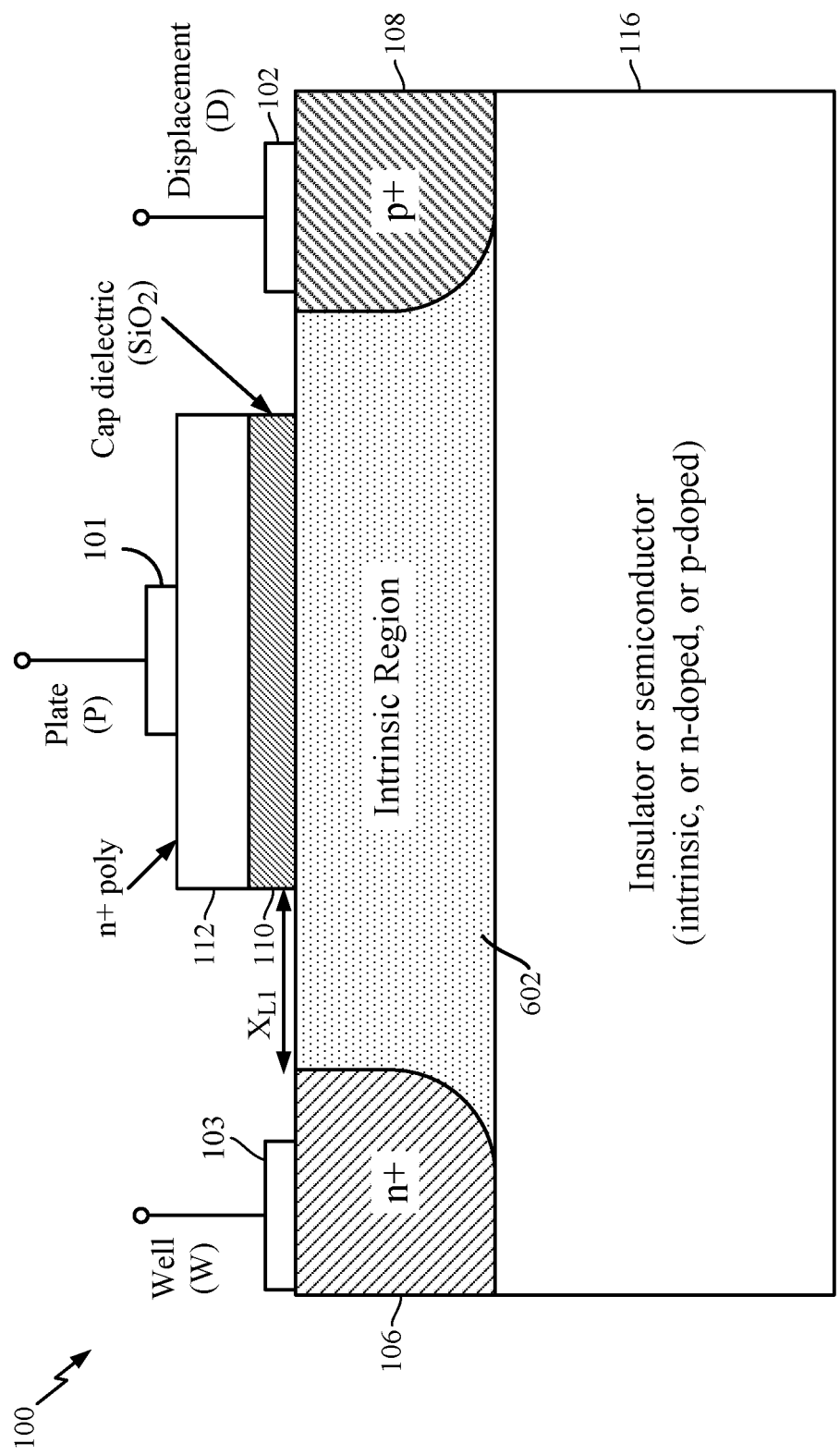
FIG. 6A illustrates a transcap device implemented with an intrinsic region, in accordance with certain aspects of the present disclosure.

FIG. 6A illustrates the transcap device 100 implemented with an intrinsic region 602, in accordance with certain aspects of the present disclosure. In this case, the intrinsic region 602 spans the entire region between the non-insulative region 106 and the non-insulative region 108.

FIGS. 6B and 6C illustrate a cross-section and a top-down view, respectively, of the transcap device 100 implemented with an intrinsic region 602, an n-well region 302, and a p-well region 304, in accordance with certain aspects of the present disclosure. As illustrated, the semiconductor region of the transcap device 100 of FIG. 6B is implemented with the intrinsic region 602, disposed between the n-well and p-well regions 302 and 304. In some cases, the intrinsic region 602 may be a lightly doped p-type (or n-type) region having a concentration on the order of 1e12 $cm^{-3}$.

When a positive bias voltage is applied at the P terminal, the intrinsic region 602 is inverted at its interface with the plate oxide layer (assuming that this region is a lightly doped p-type region), and electrons are accumulated in the n-well region 302. This causes the maximum capacitance of the transcap device to be the same as that of a transcap device realized without an intrinsic region. However, when the P or W terminals are biased such that the transcap device is operated in depletion, the intrinsic region may be depleted faster, causing a steeper reduction in the capacitance with respect to the control voltage when compared to a transcap device implemented without an intrinsic region.

Figure 7:
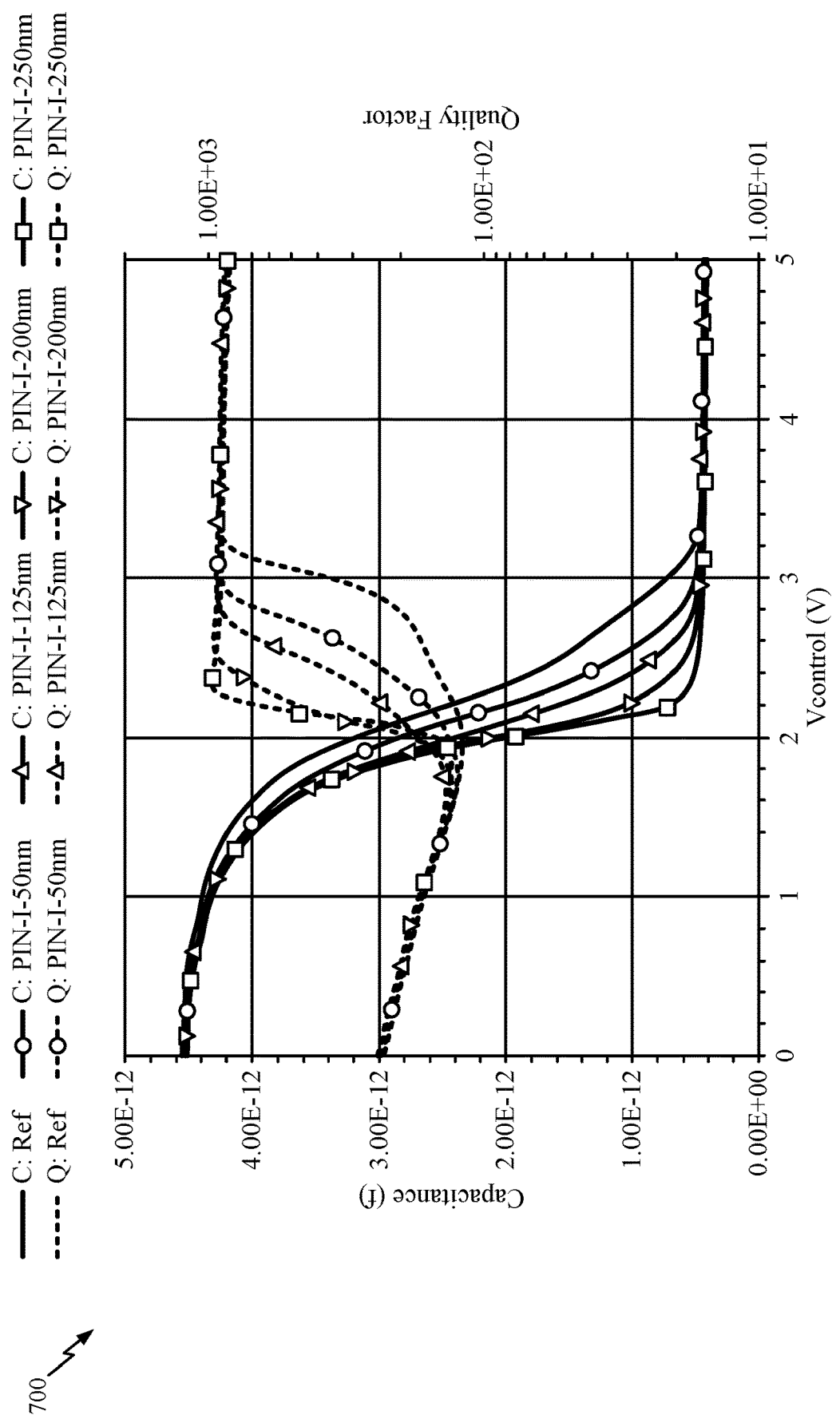
FIG. 7 is a graph illustrating the capacitance and Q of a transcap device as a function of control voltage, with different intrinsic region lengths, in accordance with certain aspects of the present disclosure.

FIG. 7 is a graph 700 illustrating the capacitance and Q of the transcap device 100 of FIGS. 6B and 6C as a function of the control voltage, with different intrinsic region lengths, in accordance with certain aspects of the present disclosure. The graph 700 shows that the transcap device 100 of FIGS. 6B and 6C may be configured to reduce the control voltage up to 1 V and improve Q by up to 20% without degrading the tuning range. The observed improvement in the device Q may be due to the effect of the lateral depletion region caused by the p-n junction, which dominates over the vertical depletion region caused by the plate when the control bias in increased, reducing the maximum effective resistance between the P and W terminals. In certain aspects, an intrinsic region may be added to a two-terminal metal-oxide semiconductor (MOS) varactor to improve the device performance, as described in more detail with respect to FIGS. 8A and 8B.

Figure 8A:
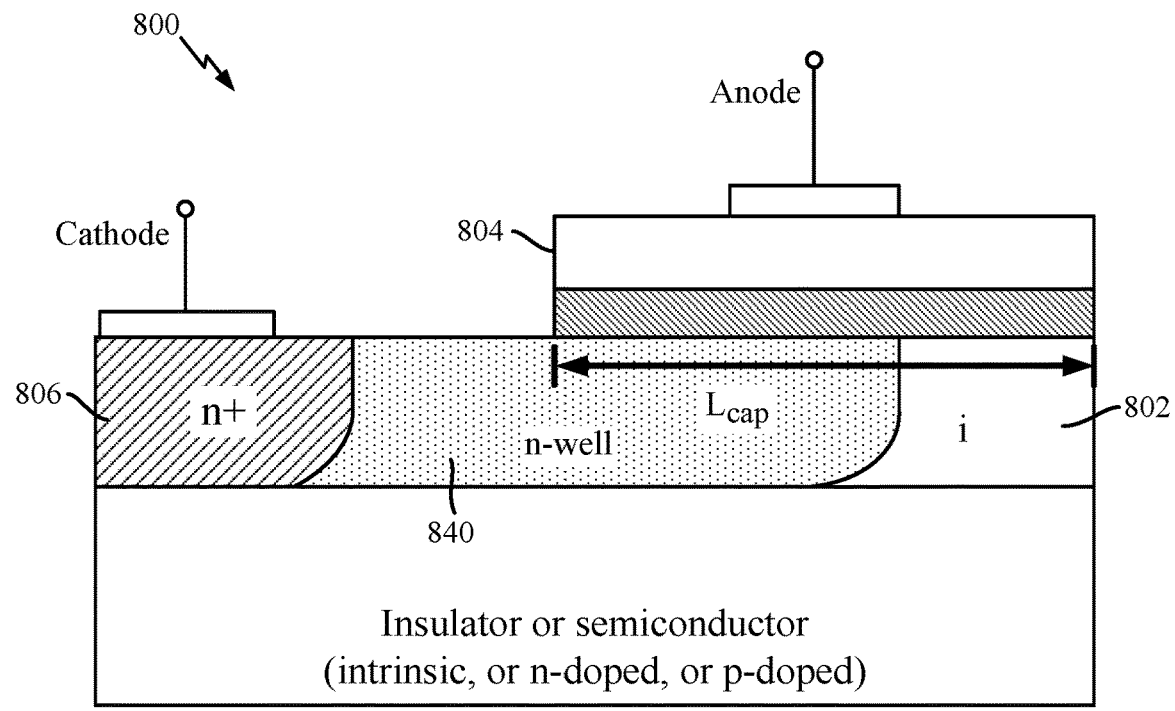
FIGS. 8A and 8B illustrate semiconductor variable capacitors, each implemented with an intrinsic region underneath a non-insulative region for an anode of the capacitor, in accordance with certain aspects of the present disclosure.
Figure 8B:
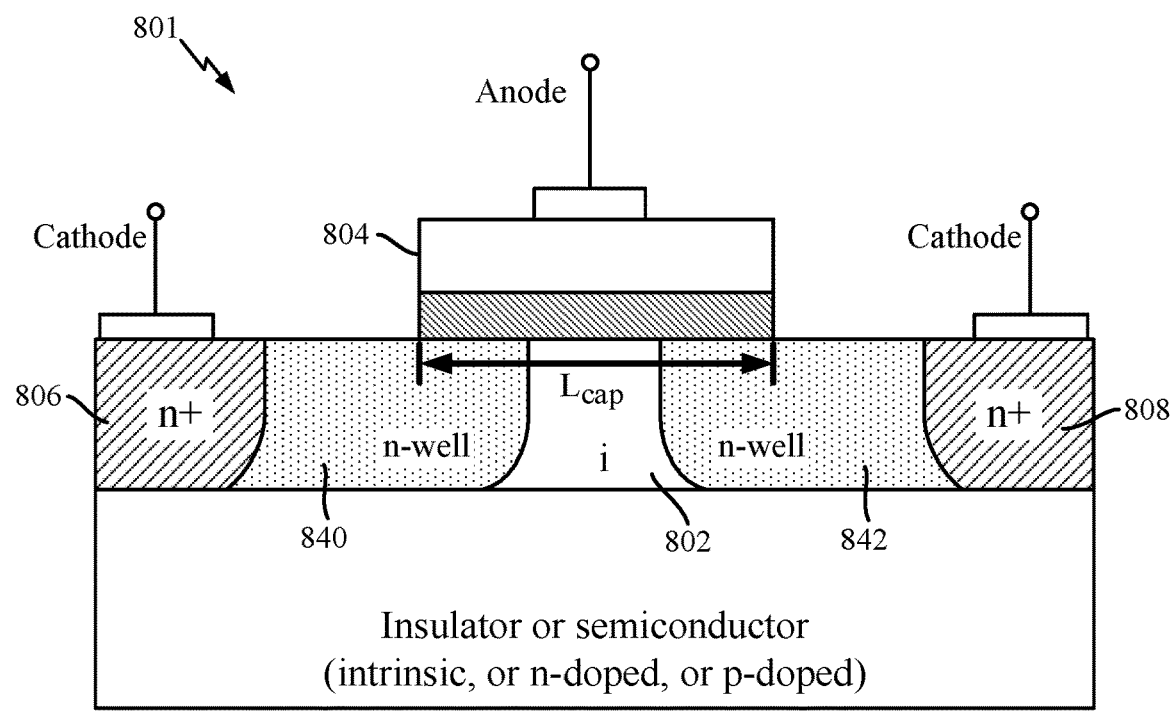

FIGS. 8A and 8B illustrate capacitors 800 and 801, respectively, implemented with an intrinsic region 802 underneath the non-insulative region 804 for the anode, in accordance with certain aspects of the present disclosure. In certain aspects, the capacitor may include a single cathode, as illustrated by capacitor 800 of FIG. 8A, or two cathodes, as illustrated by capacitor 801 of FIG. 8B. The intrinsic region 802 may be disposed between the non-insulative regions 806 and 808 coupled to the cathodes. In certain aspects, the cathodes of capacitor 801 may be shorted, providing a two-terminal capacitor. In certain aspects, the capacitors 800 and 801 may optionally include n-well regions 840 and/or 842. In some cases, the n-well regions 840 and/or 842 may be replaced with heavily doped regions.

Figure 9:
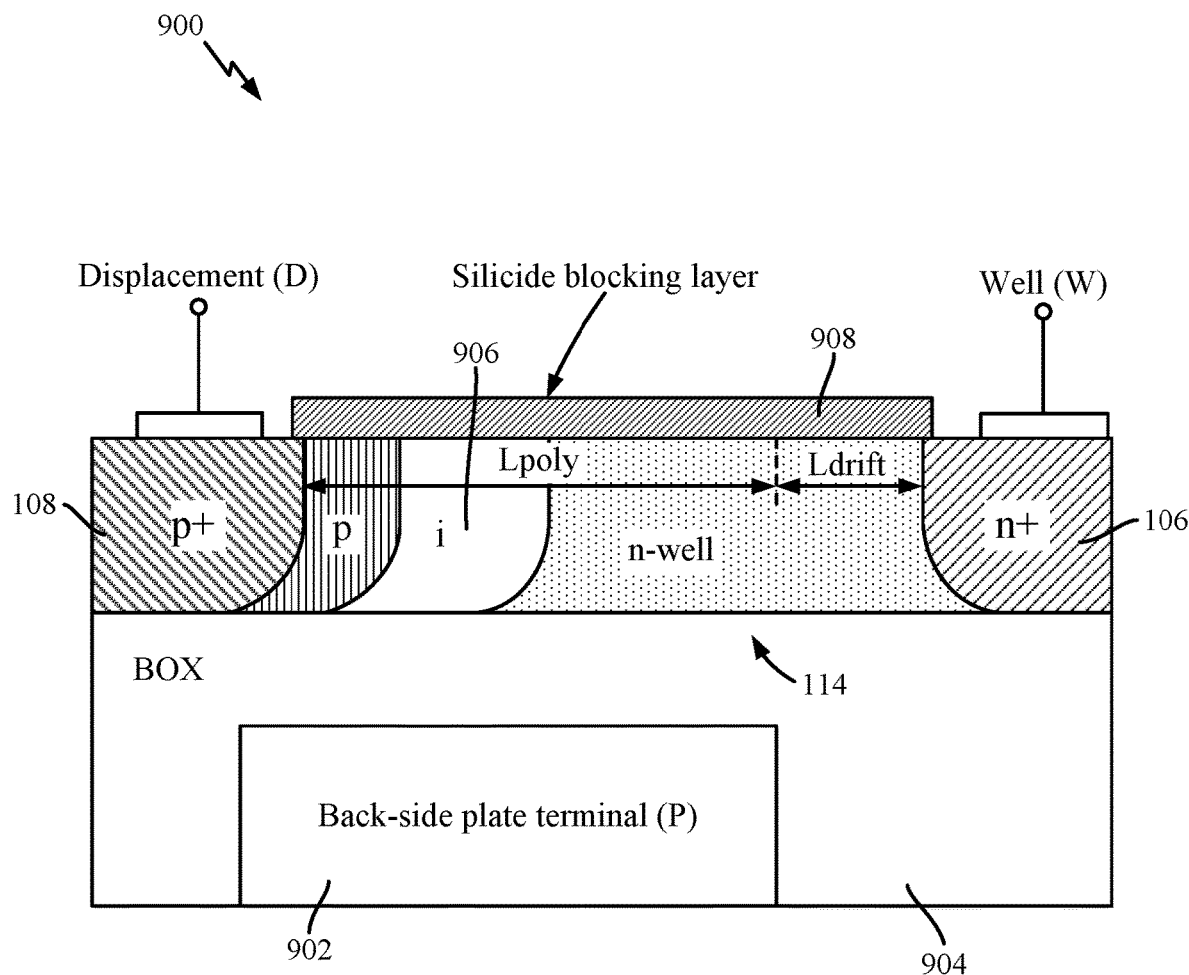
FIG. 9 illustrates a transcap device implemented with a backside plate, in accordance with certain aspects of the present disclosure.

In certain aspects of the present disclosure, the example transcap devices and capacitors described herein may be implemented using a back-gate configuration, as described in more detail with respect to FIG. 9.

FIG. 9 illustrates an example transcap device 900 implemented using a back-gate configuration, in accordance with certain aspects of the present disclosure. For example, a non-insulative region 902 (e.g., a back-side plate terminal) may be formed below at least a portion of a buried oxide (BOX) region 904 of the transcap device 900. Therefore, the BOX region 904 may be used as the plate oxide, and a backside cavity contact may be used as a plate terminal, enabling the use of the transcap device 900 in high voltage applications, for example.

While reducing the maximum control voltage is not a primary objective for this transcap device configuration, the tuning-range-versus-Q performance of the transcap device 900 may be improved by incorporating an intrinsic region 906. The configuration of the transcap device 900 allows for the fabrication of thick oxide transcaps with oxide thicknesses in the range of 30-40 nm with operating voltages up to 15-20 V, for example. In certain aspects, a silicide-blocking layer 908 may be formed above at least a portion of the semiconductor region 114 to prevent the junctions between the different regions of the semiconductor region 114 from being shorted.

Figure 10A:
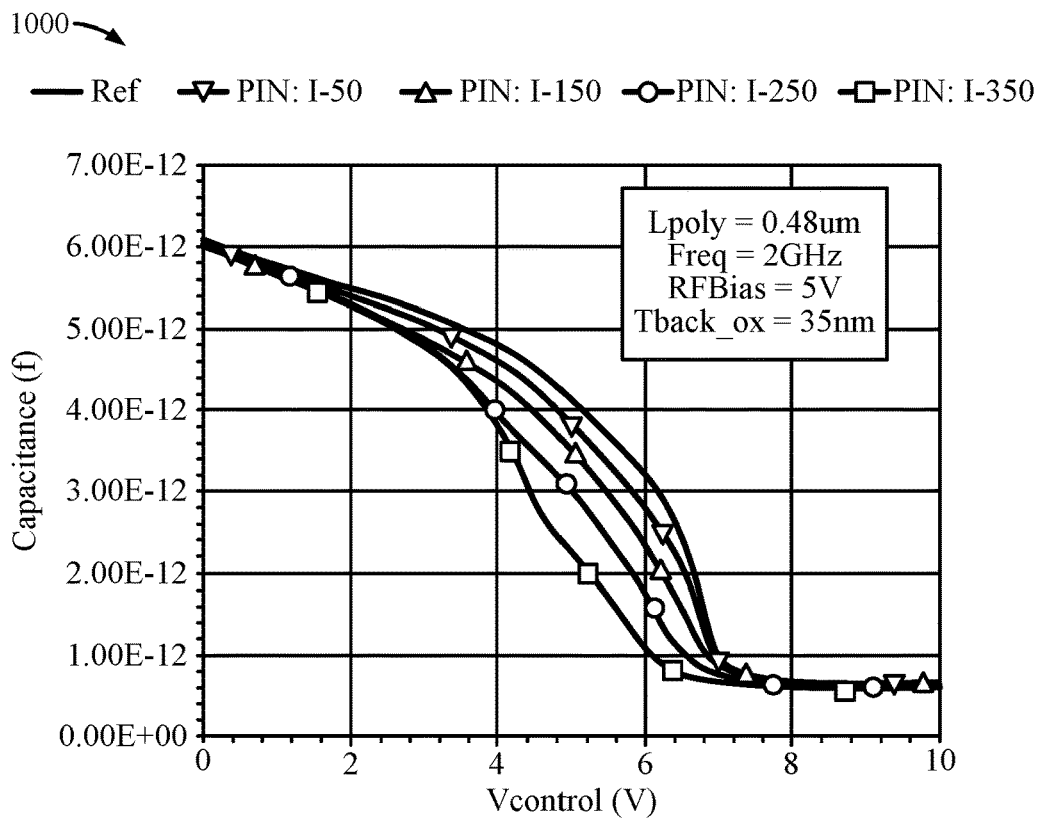
FIGS. 10A and 10B are graphs showing the capacitor-voltage (C-V) characteristics and the Q, respectively, of the transcap device of FIG. 9 for different intrinsic region lengths, in accordance with certain aspects of the present disclosure.
Figure 10B:
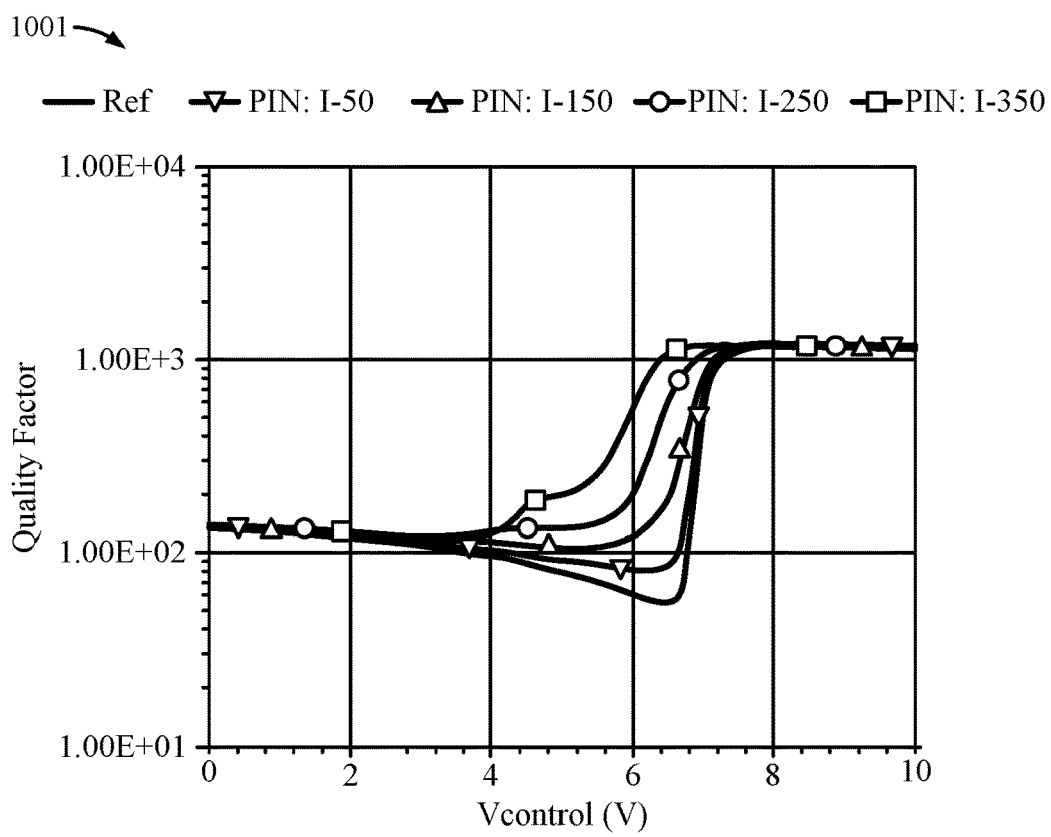

FIGS. 10A and 10B illustrate graphs 1000 and 1001 showing the C-V characteristics and the Q, respectively, of the transcap device 900 for different intrinsic region lengths, in accordance with certain aspects of the present disclosure. As illustrated in graph 1001, the Q of the transcap device 900 is improved as compared to a reference (ref) transcap device incorporated without an intrinsic region. Moreover, there is little to no impact to the tuning range of the transcap device 900 by incorporating the intrinsic region 906, as illustrated in graph 1000. For example, the transcap device 900 (e.g., implemented with a 35 nm oxide, a poly length (Lpoly) of 0.48 µm and a 0.25 µm intrinsic region length) provides a Q of about 122 as compared to a Q of 55 for the reference device for a tuning range of 10 x. As illustrated in FIG. 9, Lpoly is the length of the semiconductor region 114 from an edge of the non-insulative region 108 to an edge of the non-insulative region 902.

Example Transcap Device Implemented Using a Flat-Band (FB) Adjustment Region

As presented above, the horizontal doping profile can be engineered to modulate the transcap device performance. Moreover, certain aspects of the present disclosure provide a transcap device architecture that softens the trade-off between the control voltage setting for achieving a high tuning range and other device figures of merit by engineering the vertical doping profile of the transcap device, and as a result, increasing design flexibility of the transcap device. In certain aspects, the vertical doping profile underneath the plate oxide may be engineered to modify the electrical field distribution of the transcap device during operation, while also shifting the flat-band voltage of the transcap device, as described in more detail herein.

Figure 11A:
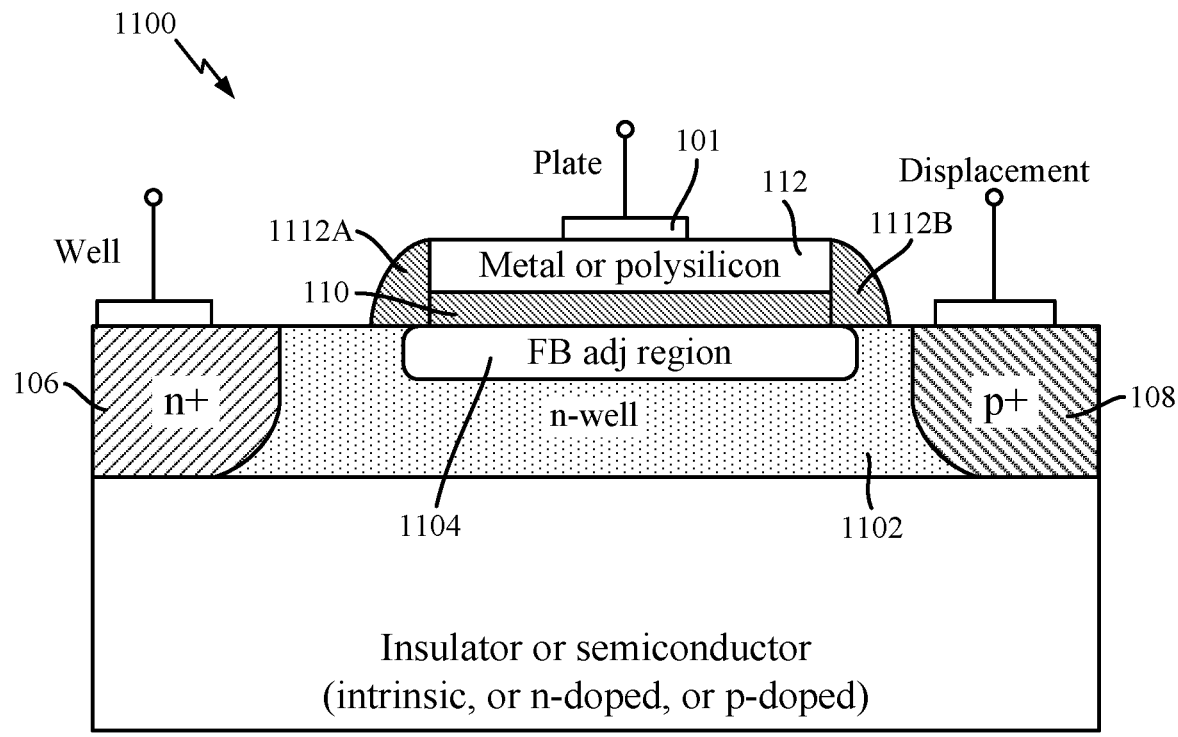
FIGS. 11A and 11B illustrate example structures of transcap devices implemented using a flat-band (FB) adjustment region, in accordance with certain aspects of the present disclosure.
Figure 11B:
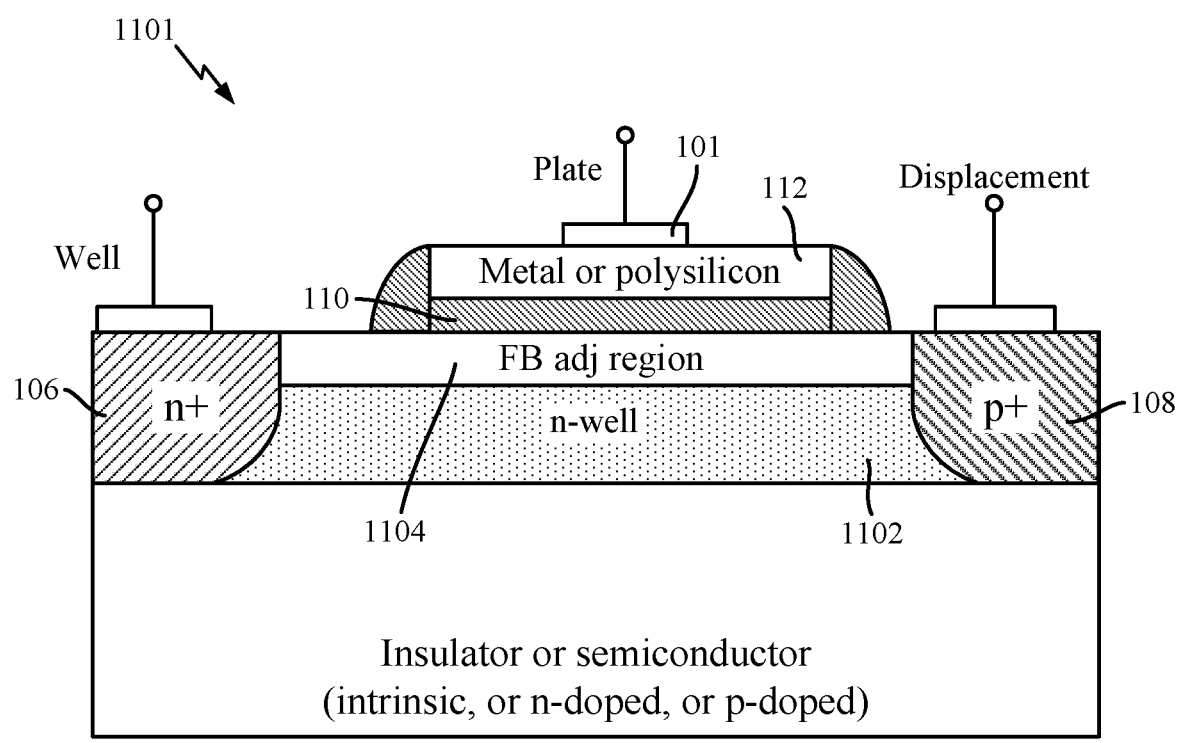

FIGS. 11A and 11B illustrate example structures of transcap devices 1100 and 1101, respectively, implemented using a flat-band (FB) adjustment region 1104, in accordance with certain aspects of the present disclosure. As used herein, FB voltage generally refers to the voltage at which there is no electrical charge in a semiconductor, and therefore, no voltage drop across the semiconductor. For example, the FB voltage may represent the voltage at which the energy bands of the semiconductor are horizontal (flat). In certain aspects, the FB adjustment region 1104 (e.g., a layer of silicon) may be disposed in a region below the plate oxide layer 110 to adjust the FB voltage of the transcap devices 1100 and 1101. As illustrated in FIG. 11A, the FB adjustment region 1104 may be disposed only in the region (or part of the region) below the plate oxide layer 110 and spacers 1112A and 1112B, or as illustrated in FIG. 11B, the FB adjustment region 1104 may span from the non-insulative region 106 to the non-insulative region 108. For other aspects (not shown), the FB adjustment region 1104 may contact only one of the non-insulative region 106 or the non-insulative region 108. In certain aspects, the FB adjustment region 1104 may be n-doped or p-doped. For an n-type transcap device, such as the transcap device 1100 with an n-well non-insulative region 1102, if the FB adjustment region 1104 is n-doped, then the FB voltage may be shifted towards higher control voltages, while the FB voltage may be shifted in the opposite direction if a p-type FB adjustment region 1104 is used, or vice versa for a p-type transcap device.

Figure 12A:
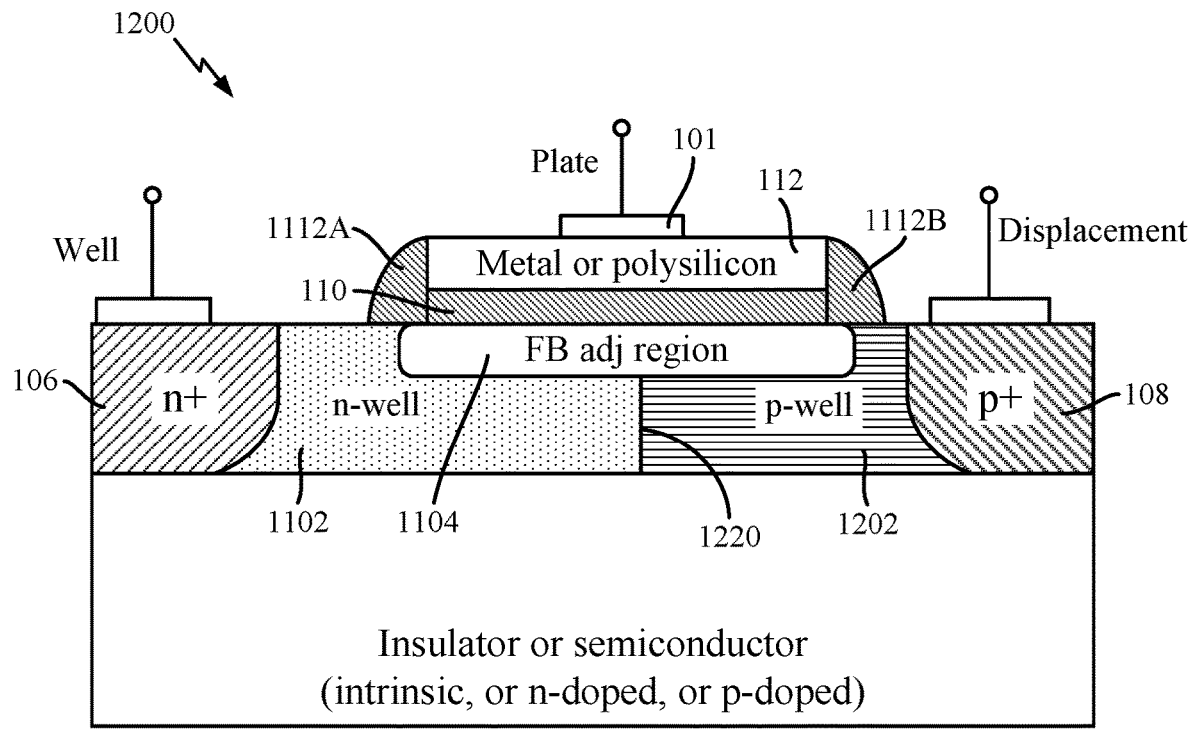
FIGS. 12A and 12B illustrate example structures of transcap devices having a p-n junction and an FB adjustment region formed underneath a plate oxide layer, in accordance with certain aspects of the present disclosure.
Figure 12B:
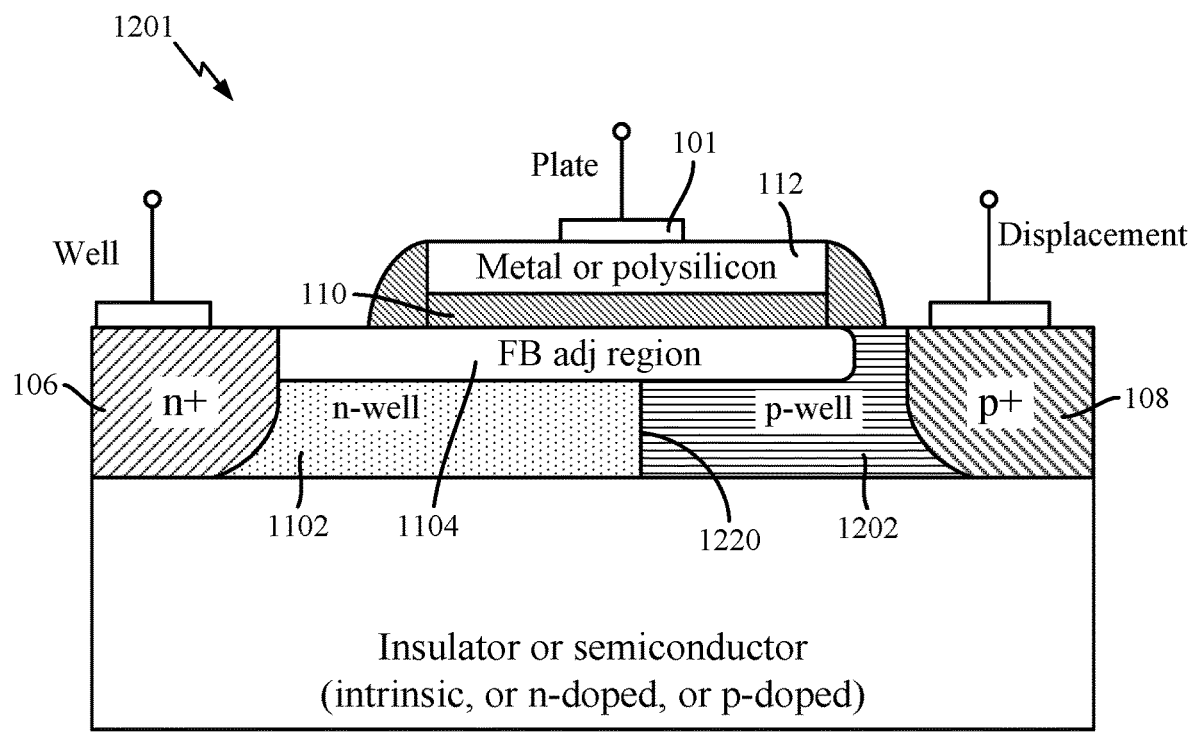

FIGS. 12A and 12B illustrate example structures of transcap devices 1200 and 1201, respectively, having a p-n junction 1220 and an FB adjustment region 1104 formed underneath the plate oxide layer 110, in accordance with certain aspects of the present disclosure. By adding the p-well non-insulative region 1202, a p-n junction 1220 is formed below the plate oxide layer 110. As described previously, the formation of the p-n junction 1220 allows for a sharper transition between high and low capacitance values of the transcap device. However, the p-n junction 1220 may also shift the FB voltage of the transcap device to lower control voltages and degrade the quality factor (Q) of the transcap device. In certain aspects of the present disclosure, an FB adjustment region 1104 is disposed between the plate oxide layer and the semiconductor region of the transcap device to mitigate (or even cancel) these adverse effects.

As illustrated in FIG. 12A, the FB adjustment region 1104 may be disposed only in the region (or part of the region) below the plate oxide layer 110 and spacers 1112A and 1112B, or as illustrated in FIG. 12B, the FB adjustment region 1104 may span from beneath the plate oxide layer 110 to the non-insulative region 106. In some cases, the FB adjustment region 1104 may span from beneath the plate oxide layer 110 to the non-insulative region 108. In certain aspects, the FB adjustment region 1104 may be an n-type implant region with a peak concentration centered at 30 nm from the silicon/dielectric interface with a peak doping concentration equal to the doping concentration of the n-well implantation (e.g., non-insulative region 1102).

Figure 13:
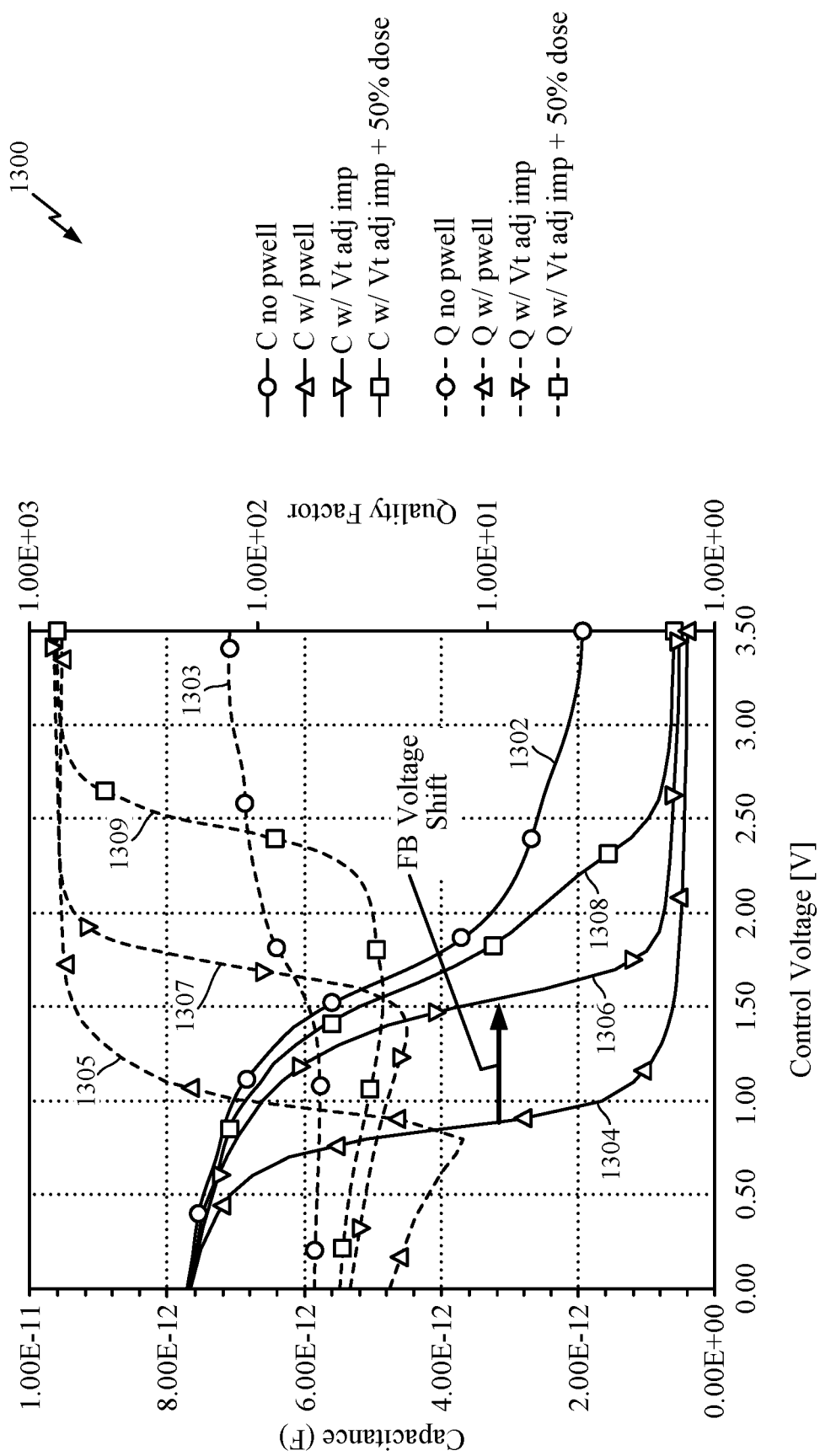
FIG. 13 is a graph showing the C-V characteristics and the Q of transcap devices implemented with or without an FB adjustment region, in accordance with certain aspects of the present disclosure.

FIG. 13 is a graph 1300 showing the C-V characteristics and the Q of various transcap devices implemented with or without a p-n junction (e.g., p-n junction 1220) below the plate oxide and implemented with or without the FB adjustment region 1104, in accordance with certain aspects of the present disclosure. The curves 1302 and 1303 illustrate the capacitance and Q, respectively, of the transcap device 1200 implemented without the p-well non-insulative region 1202 or the FB adjustment region 1104. The curves 1304 and 1305 illustrate the capacitance and Q, respectively, of the transcap device 1200 implemented with the p-well non-insulative region 1202 but without the FB adjustment region 1104. As illustrated, adding the p-well non-insulative region 1202 allows for a sharper transition between high and low capacitance values of the transcap device. However, the inclusion of the p-well non-insulative region 1202 degrades the Q and shifts the FB voltage to lower control voltages.

The curves 1306 and 1307 illustrate the capacitance and Q, respectively, of the transcap device 1200 with the p-well non-insulative region 1202 and the FB adjustment region 1104. As illustrated, the inclusion of the FB adjustment region 1104 shifts the FB voltage to higher control voltages, compensating for the FB voltage shift caused by the inclusion of the p-well non-insulative region 1202. In certain aspects, the doping concentration of the FB adjustment region 1104 may be increased to further shift the FB voltage to higher control voltages. For example, the curves 1308 and 1309 illustrate the capacitance and Q, respectively, of the same transcap device represented by curves 1306 and 1307, but with the doping concentration of the FB adjustment region 1104 increased by one and half times. As illustrated, the FB voltage is shifted to higher control voltages as compared to the transcap device represented by curves 1306 and 1307.

While the examples provided herein have illustrated several structures of transcap devices having FB adjustment regions, other variants of the transcap structures may be implemented. For example, the FB adjustment region may be limited to only the p-well or the n-well side of the transcap device 1200. As another example, a more complicated vertical profile may be used in conjunction with the FB adjustment region by, for example, including an intrinsic region as illustrated in FIG. 6B.

Figure 14:
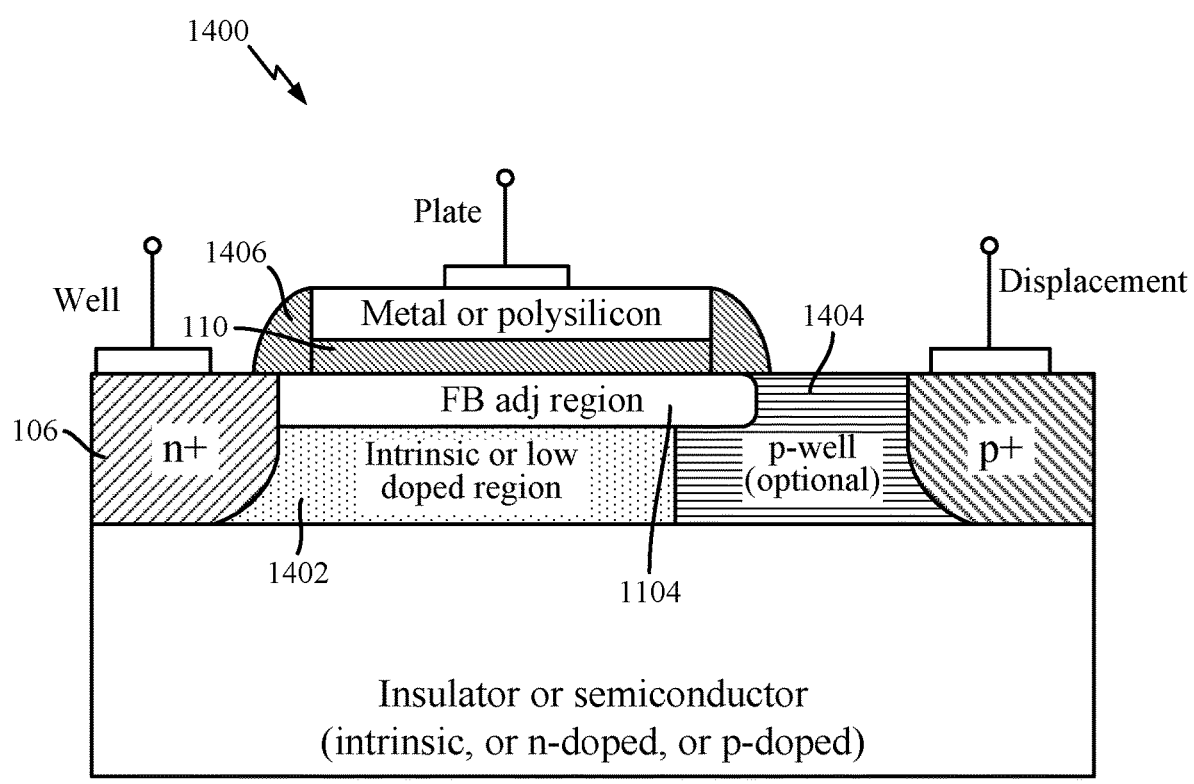
FIG. 14 illustrates an example structure of a transcap device having an intrinsic region and an FB adjustment region formed underneath a plate oxide layer, in accordance with certain aspects of the present disclosure.

FIG. 14 illustrates an example structure of a transcap device 1400 having an intrinsic region 1402 and an FB adjustment region 1104 formed underneath the plate oxide layer 110, in accordance with certain aspects of the present disclosure. As used herein, the term "intrinsic" refers to an intrinsic semiconductor or a near-intrinsic semiconductor (e.g., lightly-doped semiconductor). For example, an intrinsic region may be a lightly doped p-type (or n-type) region having a concentration of less than $1e12$ $cm^{-3}$. The transcap device 1400 may optionally include a p-well region 1404, as illustrated. Moreover, the non-insulative region 106 (e.g., n+ region) may be aligned with the edge of the spacer 1406 to further improve the Q of the transcap device 1400.

Figure 15A:
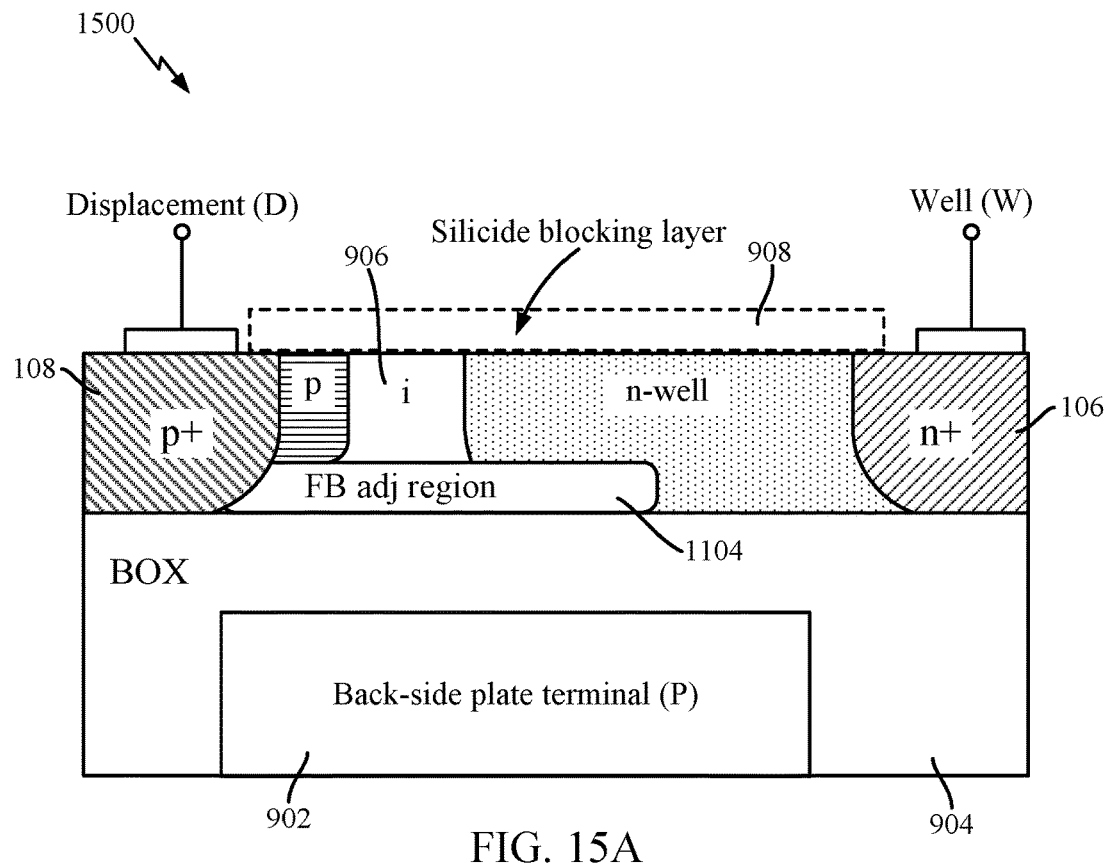
FIGS. 15A and 15B illustrate example transcap devices implemented using a back-gate configuration and having an FB adjustment region, in accordance with certain aspects of the present disclosure.
Figure 15B:
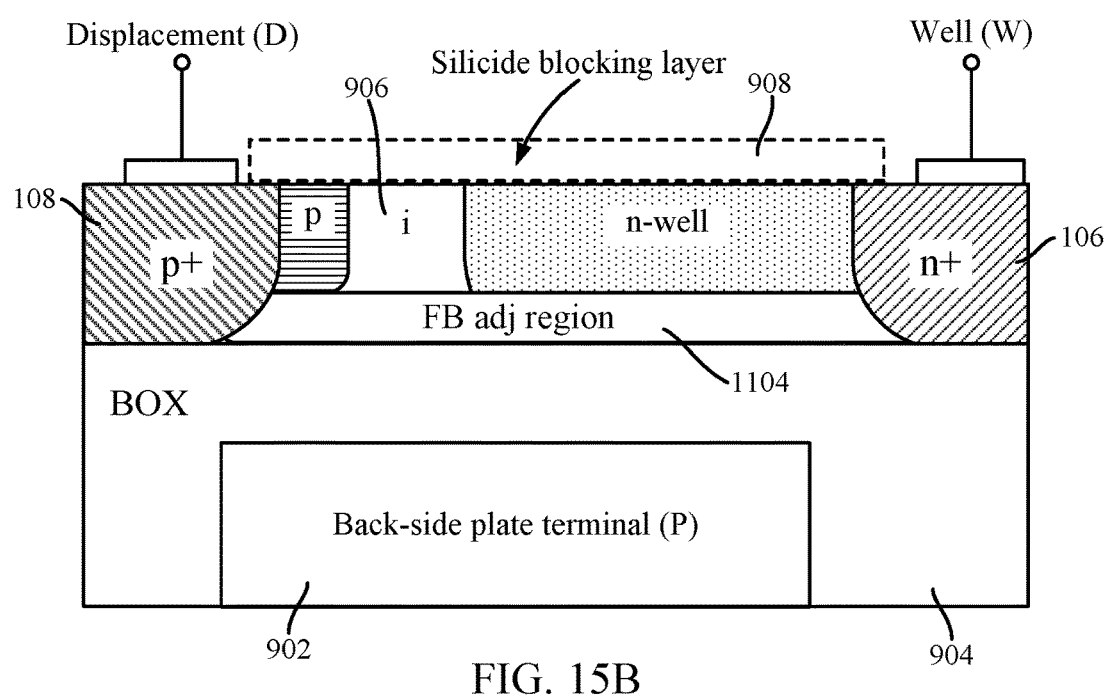

FIGS. 15A and 15B illustrate example transcap devices 1500 and 1501, respectively, implemented using a back-gate configuration and having an FB adjustment region 1104, in accordance with certain aspects of the present disclosure. As illustrated, the FB adjustment region 1104 may be disposed above the non-insulative region 902 (e.g., back-side plate terminal). As illustrated in FIG. 15A, the FB adjustment region 1104 may be disposed only in the region above the non-insulative region 902, or as illustrated in FIG. 15B, may span from the non-insulative region 106 to the non-insulative region 108. In certain aspects, the FB adjustment region 1104 may contact the non-insulative region 108, but not the non-insulative region 106 (as illustrated in FIG. 15A), while in other aspects (not shown), the FB adjustment region 1104 may contact the non-insulative region 106, but not the non-insulative region 108.

In certain aspects, the FB adjustment region 1104 as described herein may be implemented using a semiconductor material having an energy band-gap that is different from an energy band-gap of the semiconductor region (e.g., semiconductor region 114). For example, the FB adjustment region 1104 as described herein may be implemented using a thin layer of silicon germanium (SiGe). In certain aspects, the mole fraction of the germanium (Ge) or the strain conditions used to form the SiGe may be adjusted to set the FB voltage of the transcap device.

In certain aspects, the FB adjustment region 1104 as described herein may be formed using any of various suitable techniques, such as an epitaxial process step. For high-k metal gate (HKMG) technologies, where the high-k dielectric is formed after the implantation of the source and drain regions, in order to obtain a shallow FB adjustment region, the corresponding implantation for the FB adjustment region may be performed after the formation and removal of a dummy gate and before the HKMG has been deposited. At this step, many of the thermal process steps for forming the semiconductor device have already taken place, and therefore, the diffusion of dopants related to the thermal annealing is reduced.

Figure 16:
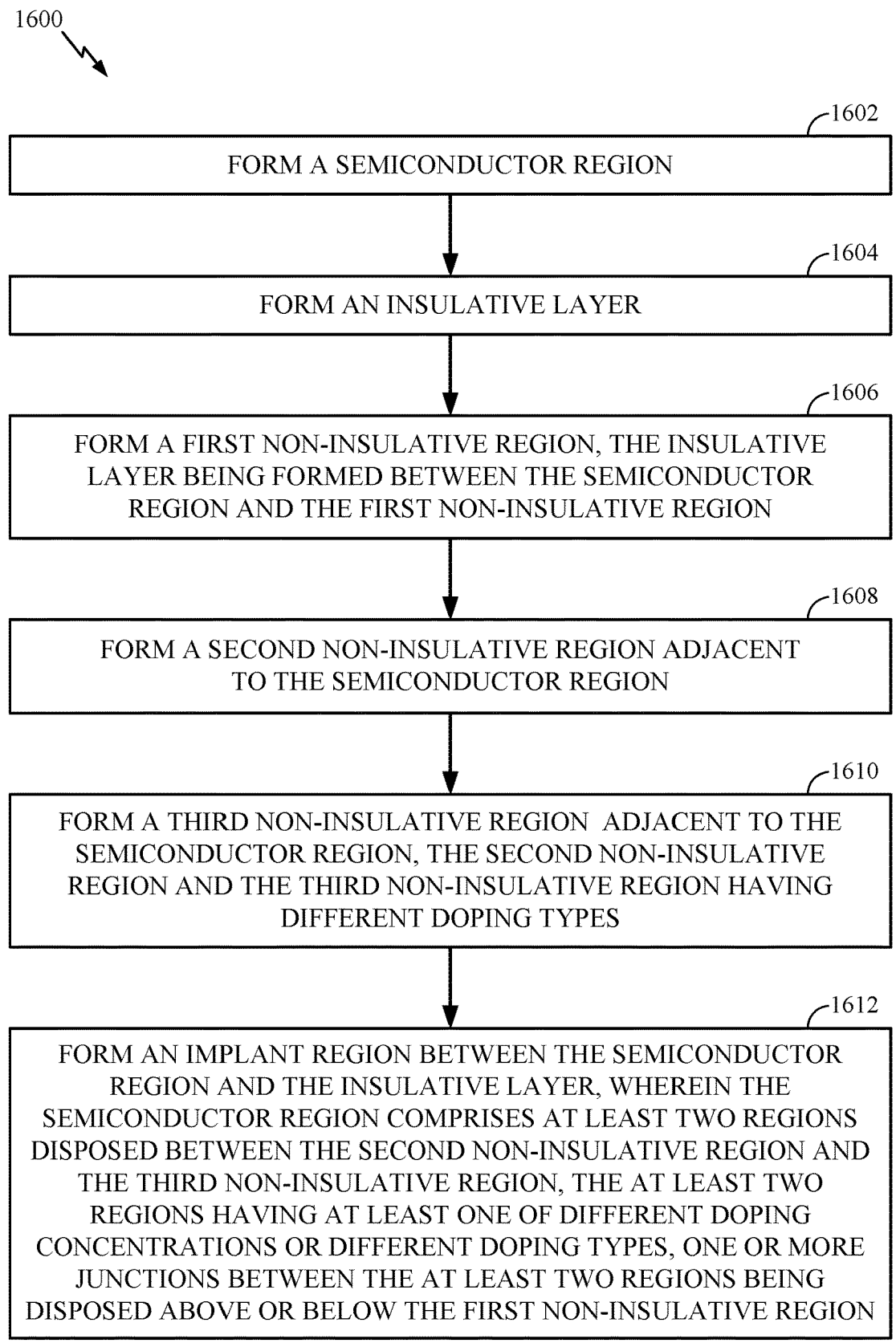
FIG. 16 is a flow diagram of example operations for fabricating a semiconductor variable capacitor, in accordance with certain aspects of the present disclosure.

FIG. 16 is a flow diagram of example operations 1600 for fabricating a semiconductor variable capacitor, in accordance with certain aspects of the present disclosure. The operations 1600 may be performed, for example, by a semiconductor-processing chamber.

The operations 1600 may begin at block 1602 by forming a semiconductor region, forming an insulative layer at block 1604, and forming a first non-insulative region at block 1606. The insulative layer is formed between the semiconductor region and the first non-insulative region. In certain aspects, the operations 1600 continue, at block 1608, by forming a second non-insulative region adjacent to the semiconductor region, and at block 1610, by forming a third non-insulative region adjacent to the semiconductor region. The second non-insulative region and the third non-insulative region have different doping types. At block 1612, an implant region may be formed between the semiconductor region and the insulative layer. In certain aspects, the semiconductor region comprises at least two regions formed between the second non-insulative region and the third non-insulative region. The at least two regions may have at least one of different doping concentrations or different doping types. Furthermore, one or more junctions between the at least two regions may be disposed above or below the first non-insulative region.

Figure 17:
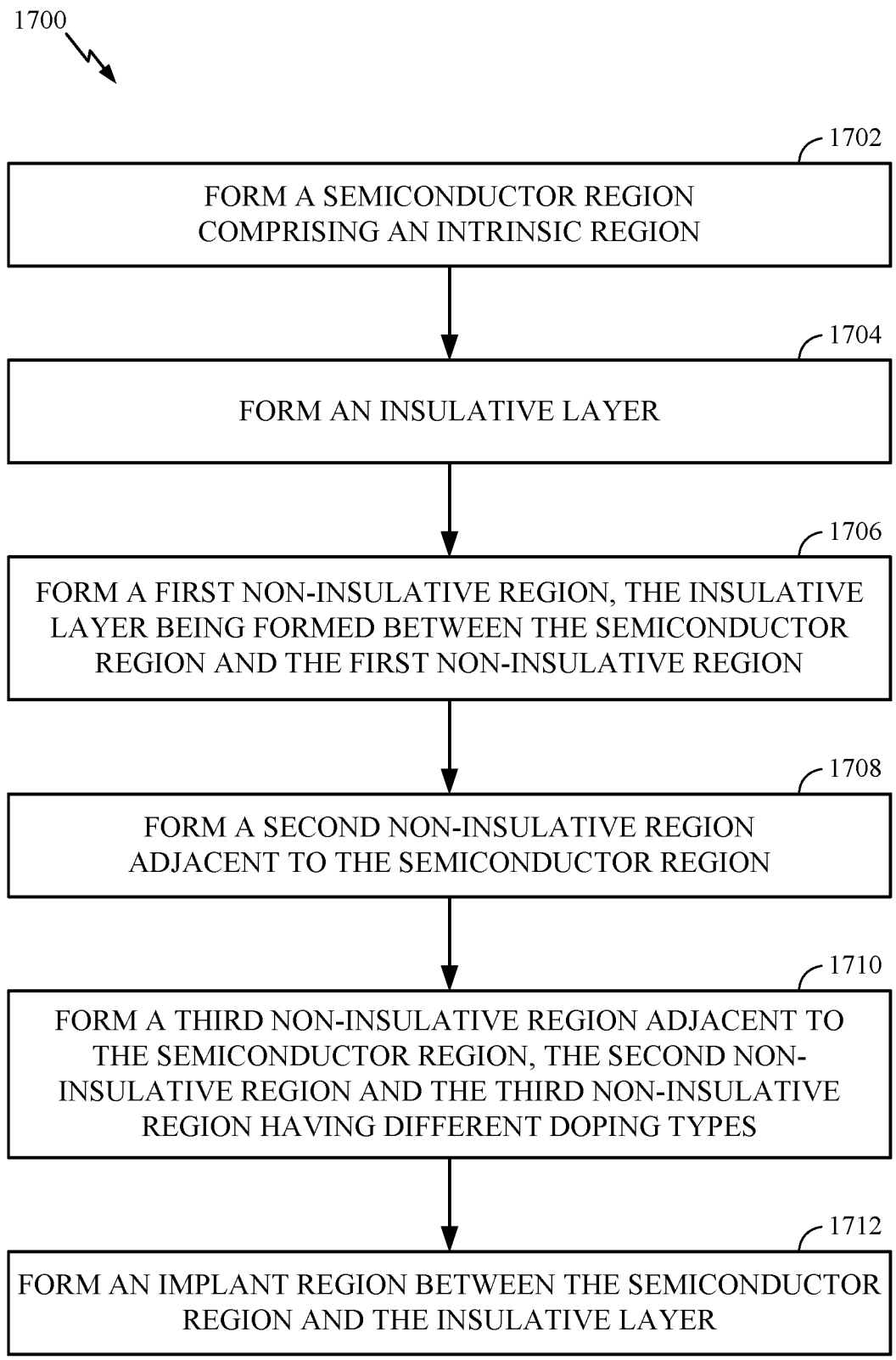
FIG. 17 is a flow diagram of example operations for fabricating a semiconductor variable capacitor having an intrinsic region, in accordance with certain aspects of the present disclosure.

FIG. 17 is a flow diagram of example operations 1700 for fabricating a semiconductor variable capacitor, in accordance with certain aspects of the present disclosure. The operations 1700 may be performed, for example, by a semiconductor-processing chamber.

The operations 1700 may begin at block 1702 by forming a semiconductor region comprising an intrinsic region, and at block 1704, forming an insulative layer. At block 1706, the operations 1700 continue by forming a first non-insulative region, the insulative layer being formed between the semiconductor region and the first non-insulative region. At block 1708, a second non-insulative region is formed adjacent to the semiconductor region, and at block 1710, a third non-insulative region is formed adjacent to the semiconductor region. In certain aspects, the second non-insulative region and the third non-insulative region may have different doping types. At block 1712, an implant region is formed between the semiconductor region and the insulative layer.

While several examples have been described herein with specific doping types to facilitate understanding, the examples provided herein may be implemented with different doping types and materials. For example, the p+ regions (e.g., non-insulative region 108) may be replaced with a Schottky contact, and/or the n+ regions (e.g., non-insulative region 106) may be replaced with a metal ohmic contact. In the case where a Schottky contact is used in combination with a III-V process technology, an extra wide bandgap layer may be interposed between the metal and the n-doped semiconductor in order to reduce the current leakage associated with the Schottky contact.

Certain aspects described herein may be implemented using different technologies, such as bulk complementary metal-oxide semiconductor (CMOS), bipolar CMOS and double-diffused metal-oxide semiconductor (DMOS) referred to as bipolar-CMOS-DMOS (BCD), bipolar CMOS (BiCMOS), bipolar, silicon on insulator (SOI) (including ultra-thin-body, fully depleted, partially depleted, high voltage, and any other SOI technology), silicon on sapphire, thin-film, trench MOS, junction field-effect transistor (JFET), fin field-effect transistor (FinFET), multi-gate FET (including tri-gate FET and gate-all-around technology), vertical MOS, silicon carbide (SiC), germanium (Ge), silicon germanium (SiGe) (any other IV-IV compound semiconductor material), III-V technology (e.g. gallium nitride (GaN), aluminum gallium nitride (AlGaN), aluminum nitride (AlN), indium nitride (InN), indium gallium nitride (InGaN), gallium arsenide (GaAs), aluminum gallium arsenide (AlGaAs), aluminum arsenide (AlAs), and any other polar and non-polar III-V compound semiconductor material including ternary and quaternary alloys) with or without heterojunctions, II-VI technology (polar and non-polar II-VI compound semiconductor material including ternary and quaternary alloys) with or without heterojunctions, or discrete device technologies (e.g., the ones used for discrete silicon or SiC MOS discrete power devices or for III-V discrete devices), including both organic and inorganic technologies. Different doping profiles can be used in order to improve the device performance. If desired, high-k dielectric materials can be used to form the capacitance dielectric so as to increase the capacitance density. The plate region can be formed with metallic or semiconductor (crystalline, poly-crystalline or amorphous) materials.

Certain aspects described herein may be realized as integrated or discrete components. A dual version of the transcap devices described herein may be obtained by substituting the n-doped regions with p-type ones and vice versa. Many other configurations may be obtained by combining different aspects discussed herein and their variants.

Certain aspects of the present disclosure may be realized with a standard SOI or bulk CMOS process. The distance between the doping implants (e.g., non-insulative region 106) and the capacitance electrode (e.g., non-insulative region 112) may be reduced by auto-aligning the implantations with the MOS structure or may be obtained by adding two spacers, as illustrated in FIGS. 12A and 12B, to the structure during the fabrication process or by misaligning the n+ (or p+) implantation mask with respect to the MOS oxide edge. The latter allows the achievement of any desired distance between the highly doped regions and the oxide edge. In certain aspects, one or more additional process steps may be used in order to form pillars/trenches in the semiconductor substrate (by means of semiconductor etching or a deposition process step) and/or to obtain the buried doped regions at the beginning of the manufacturing process.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor variable capacitor comprising:
    a semiconductor region;
    an insulative layer;
    a first non-insulative region, the insulative layer being disposed between the semiconductor region and the first non-insulative region;
    a second non-insulative region disposed adjacent to the semiconductor region;
    a third non-insulative region disposed adjacent to the semiconductor region, the second non-insulative region and the third non-insulative region having different doping types; and
    an implant region disposed between the semiconductor region and the insulative layer, wherein the semiconductor region comprises at least two regions disposed between the second non-insulative region and the third non-insulative region, wherein one of the at least two regions has a different doping concentration or doping type than the other one of the at least two regions, wherein the implant region is disposed between the insulative layer and a junction between the at least two regions.

2. The semiconductor variable capacitor of claim 1, wherein the implant region spans from the second non-insulative region to the third non-insulative region.

3. The semiconductor variable capacitor of claim 1, wherein the implant region contacts at least one of the second non-insulative region or the third non-insulative region.

4. The semiconductor variable capacitor of claim 1, wherein the junction between the at least two regions are disposed above or below the implant region.

5. The semiconductor variable capacitor of claim 1, wherein the at least two regions comprise at least two of:
    an intrinsic region;
    a p-well region; or
    an n-well region.

6. The semiconductor variable capacitor of claim 1, wherein the at least two regions comprise a p-well region, an n-well region, and an intrinsic region disposed between the n-well region and the p-well region.

7. The semiconductor variable capacitor of claim 1, wherein the at least two regions comprise a p-well region and an n-well region, wherein the second non-insulative region comprises an n-type semiconductor region, wherein the third non-insulative region comprises a p-type semiconductor region, wherein the n-well region is disposed adjacent to the n-type semiconductor region, and wherein the p-well region is disposed adjacent to the p-type semiconductor region.

8. The semiconductor variable capacitor of claim 1, wherein the insulative layer comprises at least a portion of a buried oxide (BOX) region disposed between the semiconductor region and the first non-insulative region.

9. The semiconductor variable capacitor of claim 8, wherein the implant region is disposed between the at least the portion of the BOX region and the semiconductor region.

10. The semiconductor variable capacitor of claim 8, further comprising a silicide-blocking layer, wherein the at least the portion of the BOX region and the silicide-blocking layer are disposed adjacent to opposite sides of the semiconductor region.

11. The semiconductor variable capacitor of claim 1, wherein the implant region comprises a semiconductor material having an energy band-gap that is different from an energy band-gap of the semiconductor region.

12. The semiconductor variable capacitor of claim 1, wherein a capacitance between the first non-insulative region and the second non-insulative region is configured to be adjusted by varying a control voltage applied to the third non-insulative region with respect to the first non-insulative region or the second non-insulative region.

13. A semiconductor variable capacitor comprising:
    a semiconductor region comprising an intrinsic region;
    an insulative layer;
    a first non-insulative region, the insulative layer being disposed between the semiconductor region and the first non-insulative region;
    a second non-insulative region disposed adjacent to the semiconductor region;

a third non-insulative region disposed adjacent to the semiconductor region, the second non-insulative region and the third non-insulative region having different doping types, wherein the intrinsic region is disposed between the second non-insulative region and the third non-insulative region; and an implant region disposed between the semiconductor region and the insulative layer wherein the implant region is disposed between the intrinsic region and the insulative layer.

14. The semiconductor variable capacitor of claim 13, wherein the implant region is disposed above or below the intrinsic region.

15. The semiconductor variable capacitor of claim 13, wherein the implant region spans from the second non-insulative region to the third non-insulative region.

16. The semiconductor variable capacitor of claim 13, wherein the implant region contacts the second non-insulative region.

17. The semiconductor variable capacitor of claim 13, wherein the intrinsic region is one of at least two regions disposed between the second non-insulative region and the third non-insulative region, one or more junctions between the at least two regions being disposed above or below the first non-insulative region.

18. The semiconductor variable capacitor of claim 17, wherein the at least two regions have at least one of different doping concentrations or different doping types.

19. The semiconductor variable capacitor of claim 17, wherein the one or more junctions between the at least two regions are disposed above or below the implant region.

20. The semiconductor variable capacitor of claim 17, wherein the at least two regions further comprise at least one of:
a p-well region; or
an n-well region.

21. The semiconductor variable capacitor of claim 17, wherein the at least two regions further comprise a p-well region and an n-well region, wherein the second non-insulative region comprises an n-type semiconductor region, wherein the third non-insulative region comprises a p-type semiconductor region, wherein the n-well region is disposed adjacent to the n-type semiconductor region, and wherein the p-well region is disposed adjacent to the p-type semiconductor region.

22. The semiconductor variable capacitor of claim 17, wherein the at least two regions further comprise a p-well region and an n-well region and wherein the intrinsic region is disposed between the n-well region and the p-well region.

23. The semiconductor variable capacitor of claim 13, wherein the insulative layer comprises at least a portion of a buried oxide (BOX) region disposed between the semiconductor region and the first non-insulative region.

24. The semiconductor variable capacitor of claim 23, wherein the implant region is disposed between the at least the portion of the BOX region and the semiconductor region.

25. The semiconductor variable capacitor of claim 23, further comprising a silicide-blocking layer, wherein the at least the portion of the BOX region and the silicide-blocking layer are disposed adjacent to opposite sides of the semiconductor region.

26. The semiconductor variable capacitor of claim 13, wherein the implant region comprises a semiconductor material having an energy band-gap that is different from an energy band-gap of the semiconductor region.

27. The semiconductor variable capacitor of claim 13, wherein a capacitance between the first non-insulative region and the second non-insulative region is configured to be adjusted by varying a control voltage applied to the third non-insulative region with respect to the first non-insulative region or the second non-insulative region.

* * * * *